United States Patent
Kitano et al.

(10) Patent No.: US 8,071,992 B2
(45) Date of Patent: Dec. 6, 2011

(54) SEMICONDUCTOR LIGHT-EMITTING DEVICE

(75) Inventors: Nobuaki Kitano, Hitachi (JP); Masahiro Arai, Hitachi (JP); Kazuyuki Iizuka, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 403 days.

(21) Appl. No.: 12/230,234

(22) Filed: Aug. 26, 2008

(65) Prior Publication Data

US 2009/0206354 A1   Aug. 20, 2009

(30) Foreign Application Priority Data

Feb. 20, 2008 (JP) ................................. 2008-039271

(51) Int. Cl.
*H01L 33/00* (2010.01)
(52) U.S. Cl. .................................. 257/98; 257/E33.067
(58) Field of Classification Search .................... 257/98, 257/E33.067
See application file for complete search history.

(56) References Cited

U.S. PATENT DOCUMENTS

| 4,907,846 | A * | 3/1990 | Tustison et al. | 359/359 |
| 6,277,665 | B1 * | 8/2001 | Ma et al. | 438/46 |
| 6,784,462 | B2 * | 8/2004 | Schubert | 257/98 |
| 6,797,987 | B2 * | 9/2004 | Chen | 257/98 |
| 2007/0001178 | A1 * | 1/2007 | Tran et al. | 257/79 |

FOREIGN PATENT DOCUMENTS

| JP | 2005-513787 | 5/2005 |
| WO | WO 2003/052838 A3 | 6/2003 |

* cited by examiner

*Primary Examiner* — Stephen W Smoot
*Assistant Examiner* — Vicki B Booker
(74) *Attorney, Agent, or Firm* — McGinn IP Law Group, PLLC

(57) ABSTRACT

A semiconductor light-emitting device includes a support structure, and a light-emitting structure. The support structure includes a support substrate, and a support substrate side bonding layer disposed on one surface of the support substrate. The light-emitting structure includes a light-emitting structure side bonding layer bonded to the support substrate side bonding layer, a reflection region disposed on the support substrate side bonding layer opposite the support substrate, and a semiconductor multilayer structure including a light-emitting layer disposed on the reflection region opposite the light-emitting structure side bonding layer for emitting a light with a predetermined wavelength, and a light-extraction surface disposed on the light-emitting layer opposite the reflection region for reflecting diffusely the light. The reflection region includes a transparent layer of a material with a lower refractive index than that of the semiconductor multilayer structure, and a reflection layer of a metallic material. The transparent layer has such a thickness that interference caused by multiple reflection of light inputted to the transparent layer can be suppressed.

4 Claims, 12 Drawing Sheets

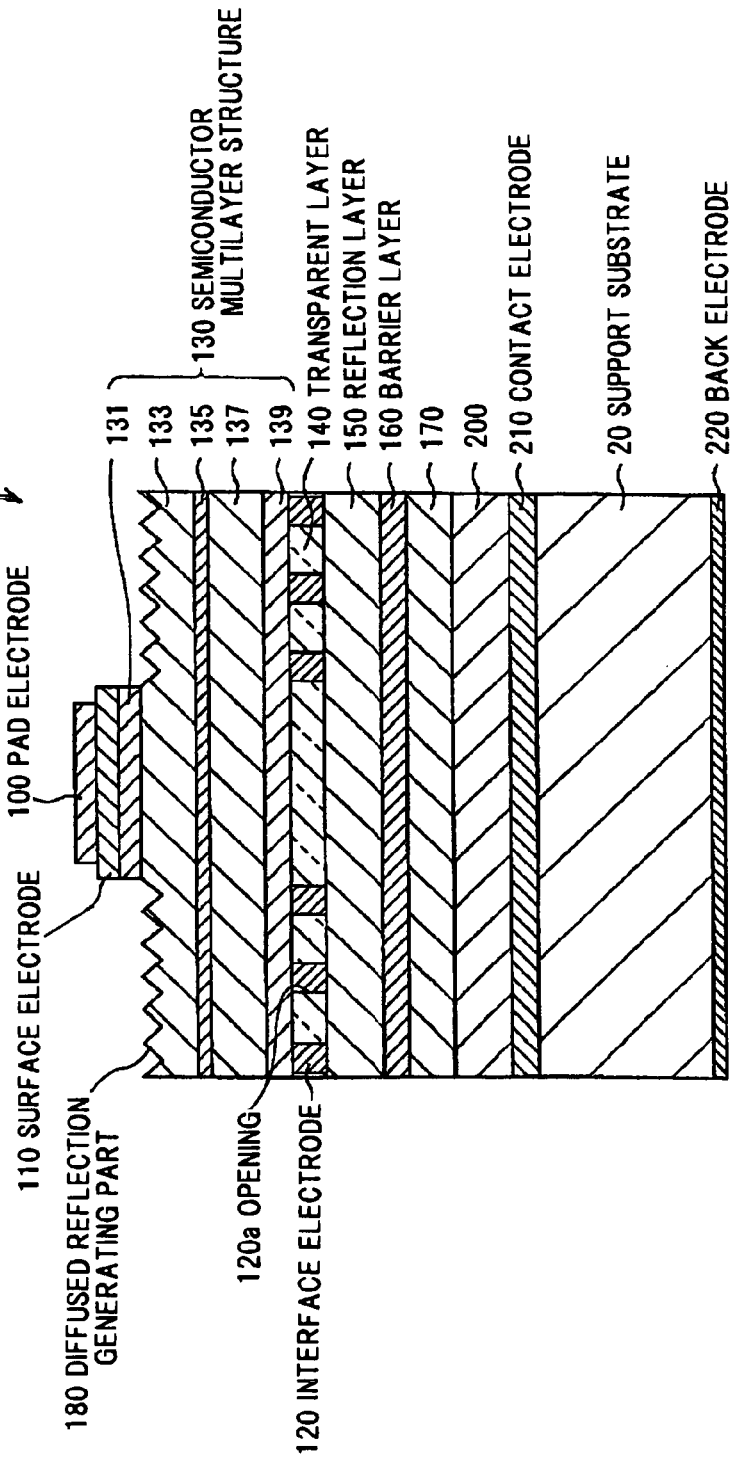

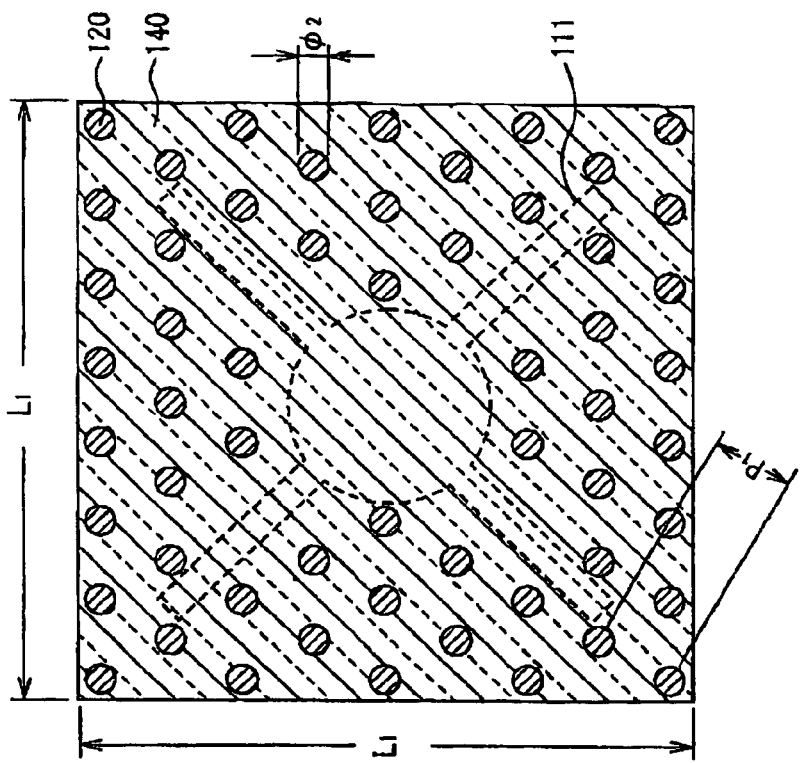
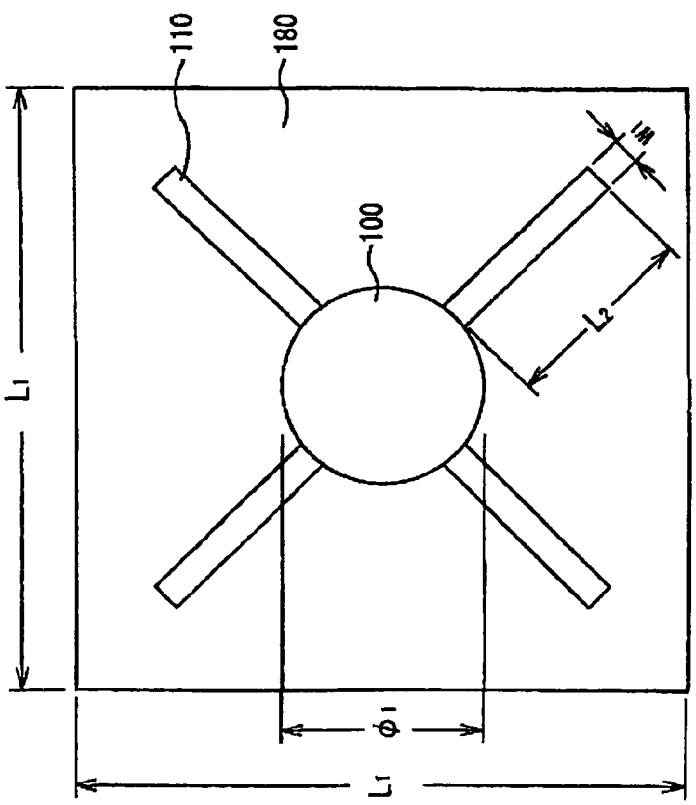

3 EPITAXIAL WAFER

- 139
- 137
- 135
- 133
- 131
- 190

130a SEMICONDUCTOR MULTILAYER STRUCTURE

10 GROWTH SUBSTRATE

190 ETCHING STOP LAYER 120a 140 120a
- 139
- 137
- 135
- 133
- 131
- 190
- 10

120 INTERFACE ELECTRODE
120a OPENING
140 TRANSPARENT LAYER 120 120a 140 120a 120
- 139
- 137
- 135
- 133
- 131
- 190
- 10

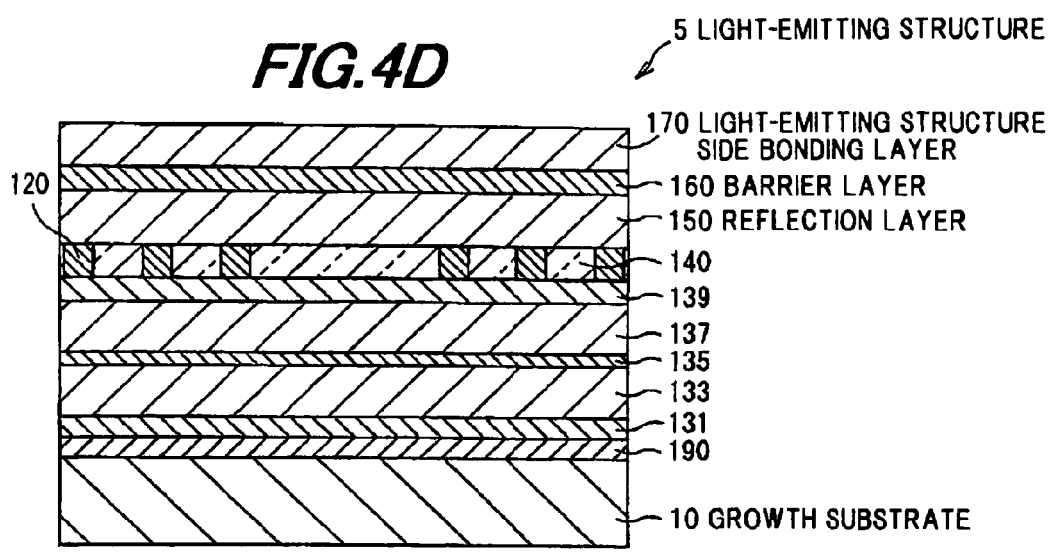
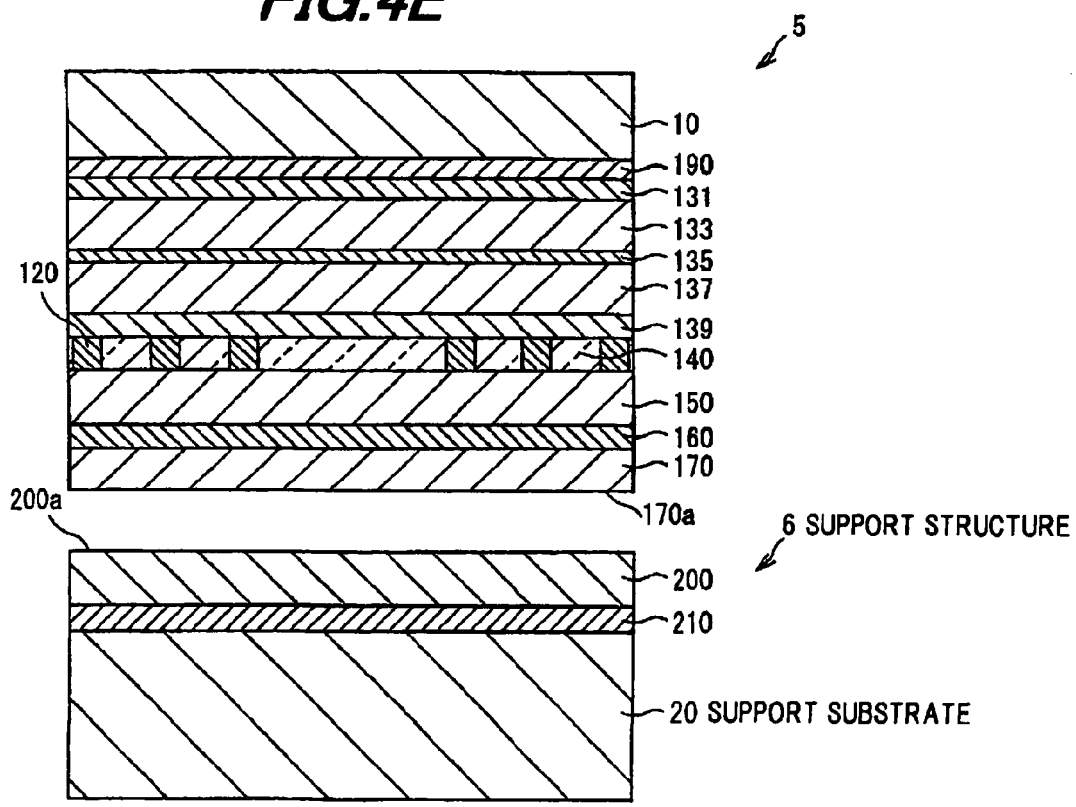

100 PAD ELECTRODE
110a-110d THIN WIRE
180 DIFFUSED REFLECTION GENERATING PART

SEMICONDUCTOR LIGHT-EMITTING DEVICE

The present application is based on Japanese patent application No. 2008-039271 filed on Feb. 20, 2008, the entire contents of which are incorporated herein by reference.

BACKGROUND OF THE INVENTION

1. Field of the Invention

The invention relates to a semiconductor light-emitting device with enhanced light-extraction efficiency.

2. Description of the Related Art

A conventional semiconductor light-emitting device (e.g., see JP-A-2005-513787) with improved light-extraction efficiency is known that is composed of a conductive holder, a semiconductor multilayer structure having multiple semiconductor layers including a light-emitting layer, a reflection layer of a metal and plural interface electrodes and formed on the conductive holder through a transparent layer having a thickness d of $\lambda/(4n)$, and a surface electrode formed on the semiconductor multilayer structure, where the interface electrodes are formed in an area except under the surface electrode. Meanwhile, $\lambda$ represents a wavelength of light emitted from the light-emitting layer, and n is a refractive index of the transparent layer.

A refractive index of the semiconductor layer composing the semiconductor light-emitting device is greater than that of the transparent layer of a dielectric material so that, of light inputted to the interface between the semiconductor layer and the transparent layer, light at an incident angle greater than a total reflection critical angle cannot be externally discharged from the device.

Here, in considering only light inputted perpendicularly to the interface between the semiconductor layer and the transparent layer, the reflectivity a reflection region becomes maximum when a thickness d of the transparent layer is $d=\lambda/(4n)$, where the reflection region is formed by sandwiching the transparent layer with a lower refractive index than that of the semiconductor layer composing the semiconductor multilayer structure, between the reflection layer and the semiconductor multilayer structure as in the semiconductor light-emitting device of JP-A-2005-513787.

The semiconductor light-emitting device of JP-A-2005-513787 functions such that light emitted from the light-emitting layer can be reflected by the reflection layer outside the device, and owing to the thickness of the transparent layer defined as $d=\lambda/(4n)$, its reflection characteristic can be enhanced with respect to light inputted perpendicularly to the reflection region composed of the transparent layer and the metal layer, whereby the light-extraction efficiency can be enhanced. Furthermore, the semiconductor light-emitting device can be enhanced in light-extraction efficiency due to having the roughened surface of the semiconductor multi-layer structure.

However, in the semiconductor light-emitting device of JP-A-2005-513787, the thickness of the transparent layer is optimized only with respect to light inputted perpendicularly to the reflection region. In other words, no optimization is considered with respect to a light component inputted obliquely to the reflection region. Therefore, in the semiconductor light-emitting device of JP-A-2005-513787, light inputted obliquely to the reflection region may be reflected repeatedly in the reflection region to reduce the intensity. Thus, of light emitted from the light-emitting layer, light inputted obliquely to the reflection region is difficult to efficiently extract from the semiconductor light-emitting device.

SUMMARY OF THE INVENTION

It is an object of the invention to provide a semiconductor light-emitting device with enhanced light-extraction efficiency that light inputted perpendicularly and obliquely to the reflection region can be efficiently extracted from the semiconductor light-emitting device.

(1) According to one embodiment of the invention, a semiconductor light-emitting device comprises:
  a support structure; and
  a light-emitting structure,
  wherein the support structure comprises:
  a support substrate; and
  a support substrate side bonding layer disposed on one surface of the support substrate, and
  the light-emitting structure comprises:
  a light-emitting structure side bonding layer bonded to the support substrate side bonding layer;
  a reflection region disposed on the light-emitting structure side bonding layer opposite the support substrate; and
  a semiconductor multilayer structure including a light-emitting layer disposed on the reflection region opposite the light-emitting structure side bonding layer for emitting a light with a predetermined wavelength, and a light-extraction surface disposed on the light-emitting layer opposite the reflection region for reflecting diffusely the light,
  wherein the reflection region includes a transparent layer comprising a material with a lower refractive index than that of the semiconductor multilayer structure, and a reflection layer comprising a metallic material, and
  the transparent layer comprises such a thickness that interference caused by multiple reflection of light inputted to the transparent layer can be suppressed.

In the above embodiment (1), the following modifications and changes can be made.

(i) The transparent layer comprises a thickness of not less than about half of a value obtained by dividing a central wavelength of light emitted from the light-emitting layer by a refractive index of the transparent layer.

(ii) The transparent layer comprises a refractive index of about 1.3 to about 3.0, and a thickness of not less than about ¾ of the value obtained by dividing the central wavelength by the refractive index.

(iii) The transparent layer comprises a refractive index of about 1.2 to about 3.0, and a thickness of not less than about ⅝ of the value obtained by dividing the central wavelength by the refractive index.

(iv) The light-emitting structure further comprises an interface electrode between the reflection layer and the semiconductor multilayer structure, the interface electrode connecting electrically a surface of the semiconductor multilayer structure opposite the light-extraction surface to the reflection layer;
  the semiconductor multilayer structure further comprises a surface electrode on a part of a surface thereof where the light-extraction surface is formed; and
  the support substrate comprises a back electrode on a surface thereof opposite the support substrate side bonding layer.

(v) The semiconductor multilayer structure further includes a semiconductor layer of a first conductive type and a semiconductor layer of a second conductive type different from the first conductive type, the light-emitting layer being disposed between the semiconductor layer of the first conductive type and the semiconductor layer of the second conductive type; and the semiconductor multilayer structure further includes a first electrode on a part of a surface of the semiconductor layer of the first conductive type on a side of the light-extraction surface and a second electrode on a part of a surface of the semiconductor layer of the second conductive type.

(vi) The interface electrode is formed in an area not more than 30% of a surface of the semiconductor multilayer structure on the side of the reflection layer.

(vii) The light-extraction surface includes an unsmooth surface that comprises an arithmetic average roughness not less than about ¼ of a value obtained by dividing a wavelength of the light by a refractive index of a semiconductor layer composing the light-extraction surface, and at least an angle being not zero and defined by a normal line of an average surface of the light-extraction surface and a normal line of a surface of the light-extraction surface.

(viii) The light-extraction surface comprises a plurality of three-dimensional structures that include a convex or concave substantially hemispherical shape.

(ix) The reflection layer comprises gold (Au), silver (Ag), copper (Cu) or aluminum (Al), or an alloy including at least one selected from the group of gold, silver, copper and aluminum.

BRIEF DESCRIPTION OF THE DRAWINGS

The invention will be explained in more detail in conjunction with appended drawings, wherein:

FIG. 1A is a schematic cross sectional view showing a semiconductor light-emitting device in a first preferred embodiment of the invention;

FIG. 1B is a top view showing the semiconductor light-emitting device in the first embodiment;

FIG. 1C is a top cutaway view showing the semiconductor light-emitting device in the first embodiment where the semiconductor light-emitting device is cut away at a transparent layer;

FIGS. 4A to 4K are schematic cross sectional views showing a process of making the semiconductor light-emitting device of the first embodiment;

DESCRIPTION OF THE PREFERRED EMBODIMENTS

Figure 2A:
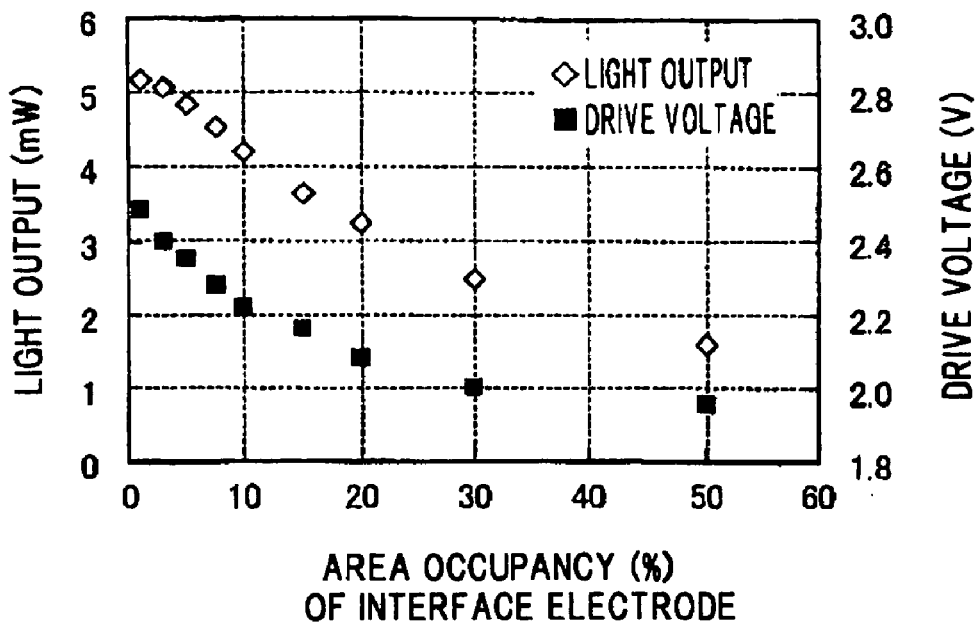
FIG. 2A is a graph showing a relationship of light output with respect to area occupancy of an interface electrode in the first embodiment.

Preferred embodiments of the present invention will be described hereinafter by referring to the accompanying drawings.

First Embodiment

FIG. 1A is a schematic cross sectional view showing the semiconductor light-emitting device in a first embodiment of the invention. FIG. 1B is a top view showing the semiconductor light-emitting device in the first embodiment, and FIG. 1C is a top cutaway view showing the semiconductor light-emitting device in the first embodiment where the semiconductor light-emitting device is cut away at a transparent layer.

Structure of Semiconductor Light-Emitting Device 1

The semiconductor light-emitting device 1 in the first embodiment is composed of a semiconductor multilayer structure 130 including a light-emitting layer 135 as an active layer for emitting light with a predetermined wavelength, a surface electrode 110 electrically connecting with a part of one surface of the semiconductor multilayer structure 130, and a pad electrode 100 disposed on the surface electrode 110 and used for wire bonding.

The semiconductor light-emitting device 1 is further composed of interface electrodes 120 electrically connecting with a part of the other surface of the semiconductor multilayer structure 130, a transparent layer 140 covering the other surface of the semiconductor multilayer structure 130 except an area where the interface electrodes 120 are formed, and a reflection layer 150 formed on the surface of the interface electrodes 120 and the transparent layer 140 not contacting the semiconductor multilayer structure 130. A reflection region is composed of the transparent layer 140 and the reflection layer 150.

The semiconductor light-emitting device 1 is further composed of a barrier layer 160 formed on the surface of the reflection layer 150 not contacting the interface electrodes 120 and the transparent layer 140, and a light-emitting structure side bonding layer 170 formed on the surface of the barrier layer 160 not contacting the reflection layer 150.

Furthermore, the semiconductor light-emitting device 1 is composed of a support substrate side bonding layer 200 electrically and mechanically connected with the light-emitting structure side bonding layer 170, a contact electrode 210 disposed on the surface of the support substrate side bonding layer 200 not contacting the light-emitting structure side bonding layer 170, a conductive support substrate 20 disposed on the surface of the contact electrode 210 not contacting the support substrate side bonding layer 200, and a back electrode 220 for die bonding formed on the surface of the support substrate 20 not contacting the contact electrode 210.

The semiconductor light-emitting device 1 of the first embodiment is formed substantially square as shown in FIG. 1B (top view). As an example, the planar dimension of the semiconductor light-emitting device 1 is about 300 μm in vertical size L1 and horizontal size L1, respectively. The thickness of the semiconductor light-emitting device 1 is about 300 μm.

The semiconductor multilayer structure 130 of the first embodiment is composed of a p-type contact layer 139 formed contacting the transparent layer 140, a p-type cladding layer 137 disposed on the surface of the p-type contact layer 139 not contacting the transparent layer 140, a light-emitting layer 135 formed on the surface of the p-type cladding layer 137 not contacting the p-type contact layer 139, an n-type cladding layer 133 formed on the surface of the light-emitting layer 135 not contacting the p-type cladding layer 137, and an n-type contact layer 131 formed at substantially the central portion of the surface of the n-type cladding layer 133 not contacting the light-emitting layer 135.

The n-type cladding layer 133 has a light extraction surface including a diffused reflection generating part 180 for reflecting diffusely a part of light emitted from the light-emitting layer 135, on the surface thereof not contacting the light-emitting layer 135. The diffused reflection generating part 180 is formed by roughening the surface of the n-type cladding layer 133. The diffused reflection generating part 180 included in the light extraction surface includes an irregular structure, or a predetermined regular structure. Furthermore, the diffused reflection generating part 180 is formed to have smooth surfaces and unsmooth surfaces. By the diffused reflection generating part 180 with the roughened form, when light emitted from the light-emitting layer 135 reaches the light extraction surface, the reflection angle of light changes such that light is diffusely reflected. Due to the diffused reflection, light increases that propagation direction is changed toward outside the semiconductor light-emitting device 1.

As an example, the semiconductor multilayer structure 130 has a double heterostructure of an AlGaInP-based compound semiconductor as a group III-V compound semiconductor. Specifically, the semiconductor multilayer structure 130 includes a multilayer structure obtained by sandwiching the light-emitting layer 135 as an undoped bulk layer of an AlGaInP-based compound semiconductor between the n-type cladding layer 133 of n-type AlGaInP as a first conductivity type compound semiconductor and the p-type cladding layer 137 of p-type AlGaInP as a second conductivity type different from the first conductivity type. The light-emitting layer 135 emits light with a predetermined wavelength when electric current is supplied from the outside. As an example, the light-emitting layer 135 emits red light with an emission wavelength of 630 nm.

Herein, the term "undoped" means that no impurities is positively added to a compound semiconductor layer including the light-emitting layer 135 and the like. Accordingly, inclusion of impurity components to be mixed unavoidably in the process of making the semiconductor multilayer structure 130 is not excluded. For example, a concentration of the impurity components to be mixed unavoidably into a compound semiconductor layer composing the semiconductor multilayer structure 130 is in the range of around $10^{13}/cm^3$ to $10^{16}/cm^3$.

The semiconductor multilayer structure 130 includes the n-type contact layer 131 of n-type GaAs formed on the side of the n-type cladding layer 133 not contacting the light-emitting layer 135, and the p-type contact layer 139 of p-type GaP formed on the side of the p-type cladding layer 137 not contacting the light-emitting layer 135. The n-type contact layer 131 and the n-type cladding layer 133 each include a predetermined n-type impurity at a predetermined concentration. For example, the n-type impurity includes Si, Se, Te and the like, and the p-type impurity includes Mg, Zn, C and the like.

The semiconductor multilayer structure 130 is formed by, for example, metal organic vapor phase epitaxy (MOVPE), metal organic chemical vapor deposition (MOCVD), molecular beam epitaxy (MBE), liquid phase epitaxy (LPE) and the like. In using MOVPE method or MOCVD, an example of source materials used for the semiconductor multilayer structure 130 includes organic metal compounds such as trimethylgallium (TMGa), triethylgallium (TEGa), trimethylaluminum (TMAl) and trimethylindium (TMIn), and hydrogenated gases such as arsine ($AsH_3$) and phosphine ($PH_3$).

As an additive material for the n-type impurity, monosilane ($SiH_4$), hydrogen selenide ($H_2Se$), diethyltellurium (DETe), dimethyltellurium (DMTe) or the like is used. As an additive material for the p-type impurity, biscyclopentadienyl magnesium ($Cp_2Mg$), dimethylzinc (DMZn), diethylzinc (DEZn) or the like is used.

The surface electrode 110 is formed in a predetermined shape on the semiconductor multilayer structure 130. For example, the surface electrode 110 is formed a circle with a cross on the n-type contact layer 131. As an example, the surface electrode 110 is formed to have a circular part with a predetermined diameter ($\phi 1$) and a plurality of legs each of which has L2 length and W1 width. For example, the surface electrode 110 is formed such that four legs, the longitudinal directions of which are by 90 degrees away from one another, are added to the circular part. As an example, the diameter $\phi 1$ of the circular part is 100 μm, and the length L2 is 100 μm and the width W1 is 15 μm in the legs. The four legs are formed such that the respective longitudinal directions of the legs are directed to the respective corners of the substantially square surface viewed from the top face of the semiconductor light-emitting device 1.

The surface electrode 110 is formed of a conductive material to be in ohmic contact with the n-type contact layer 131. For example, the surface electrode 110 is formed of a metal material such as Au, Ge, and Ni as an n-type electrode material. As an example, the surface electrode 110 is formed by stacking AuGe (50 nm thickness)/Ni (10 nm thickness) from the side of the n-type contact layer 131 in this order. The pad electrode 100 is formed substantially circular or substantially polygonal with a diameter $\phi 1$ viewed from the top face thereof. The center of the pad electrode 100 is to substantially coincide with that of the circular part of the surface electrode 110 to provide the pad electrode 100 on the surface electrode 110, and the pad electrode 100 is electrically connected with the surface electrode 110.

The diameter $\phi 1$ of the pad electrode 100 is 100 μm, as an example, in the case that the pad electrode 100 is formed substantially circular. The diameter $\phi 1$ of the pad electrode 100 may be formed smaller than that of the circular part of the surface electrode 110 in response to the diameter of a ball portion at an end of an Au wire to be ultrasonic-bonded. The pad electrode 100 is formed of a metal material such as Ti, Pt, and Au. As an example, the pad electrode 100 is formed by stacking Ti (50 nm)/Au (1000 nm) from the side of the surface electrode 110 in this order. The centers of the pad electrode 100 and the circular part of the surface electrode 110 correspond substantially to the central portion of the n-type cladding layer 133, and the interface electrodes 120 are formed in an area except directly under the pad electrode 100, the circular part of the surface electrode 110 and the legs of the surface electrode 110.

The transparent layer 140 functioning as a part of a reflection region is provided between the semiconductor multilayer structure 130 and the reflection layer 150. Specifically, the transparent layer 140 is formed on the substantially whole surface of the p-type contact layer 139 not contacting the p-type cladding layer 137, and the transparent layer 140 is in contact with the reflection layer 150 on the surface thereof not contacting the p-type contact layer 139. A region of the transparent layer 140 has openings 120a having a predetermined shape and penetrating through the transparent layer 140. The openings 120a provided in the transparent layer 140 may be formed, for example, one or plural substantially circles or polygons, or one or plural grooves. As an example, a plurality of the openings 120a are formed in the transparent layer 140 at a predetermined pitch to have a hexagonal closest packing structure as shown in FIG. 1C. In this case, the openings 120a are formed in area except dispositions 111 of the surface electrode 110 in FIG. 1C, i.e., in an area except directly under the surface electrode 110. In this case, it is to be noted that a layout of the openings 120a may be in a regular alignment such as a matrix alignment, or a random alignment so far as the openings 120a are provided in the area excluding directly under the surface electrode 110.

The transparent layer 140 is formed of a material having a refractive index lower than those of the respective semiconductor layers composing the semiconductor multilayer structure 130. Furthermore, the transparent layer 140 is formed of a material being substantially transparent with respect to light emitted from the light-emitting layer 135 and/or a material having electrical insulation. Namely, the transparent layer 140 is formed of a material being transparent optically with respect to a wavelength of light emitted from the light-emitting layer 135. The transparent layer 140 is formed of a material such as silicon dioxide, silicon nitride, tantalum pentoxide, magnesium fluoride, hafnium oxide, indium oxide, tin oxide and zinc oxide, or a metal oxide material including any of these oxides at a concentration of 80 wt % or more.

The transparent layer 140 of the first embodiment is formed such a thickness that which the interference due to multiple reflection of the light input to the transparent layer 140 can be suppressed. Specifically, the transparent layer 140 is formed in thickness a substantially half or more of the value obtained through a division of the center wavelength of light emitted from the light-emitting layer 135 by a refractive index of a material composing the transparent layer 140. Namely, the transparent layer 140 is formed in thickness $\lambda/(2n)$ or more where a center wavelength of light emitted from the light-emitting layer 135 is $\lambda$, and a refractive index of a material composing the transparent layer 140 is n.

As an example, the transparent layer 140 is formed of a material having a refractive index of about 1.3 to about 3.0, and the transparent layer 140 is formed in thickness substantially ¾ or more of a value obtained through a division of the center wavelength of light emitted from the light-emitting layer 135 by the refractive index. The transparent layer 140 may be formed, as an example, of a material having a refractive index of about 1.2 to about 3.0, and the transparent layer 140 may be formed in thickness substantially ⅝ or more of a value obtained through a division of the center wavelength of light emitted from the light-emitting layer 135 by the refractive index.

The transparent layer 140 of the first embodiment can be, for the sake of being easy formed and formed of a material which brings out good transmission characteristics with respect to a wavelength of light emitted from the light-emitting layer 135 (low characteristics of absorption loss in wavelength of light), formed of silicon dioxide (refractive index n: 1.45). Furthermore, also in the case that it is intended to improve the adhesion of the transparent layer 140 to the reflection layer 150 being in contact therewith, and to suppress the generation of voids and the like in the boundary face of the transparent layer 140 and the reflection layer 150, the transparent layer 140 is formed of silicon dioxide as an example.

The interface electrodes 120 is to electrically connect the semiconductor multilayer structure 130 with the reflection layer 150. Specifically, the interface electrode 120 is formed by filling the opening 120a defined in the transparent layer 140 with a predetermined metal material. For instance, one or plural substantially circular or polygonal openings 120a, or one or plural grooved openings 120a is (are) filled with a metal material to form the interface electrode(s) 120. As shown in FIG. 1C, the interface electrodes 120 are formed, as an example, in substantially circular dot-shapes each having a diameter $\phi2$ (e.g. 15 μm). A pitch P1 between the centers of a plurality of interface electrodes 120 is, as an example, 40 μm. The interface electrode 120 is formed of a conductive material to be in ohmic contact with the p-type contact layer 139, for example, the interface electrode 120 is formed of a metal material such as Au, Zn, and Be as a p-type electrode material. As an example, the interface electrode 120 is formed of a metal material composed of an Au—Zn alloy.

The reflection layer 150 is formed of a conductive metal material having a reflectivity of a predetermined value or more with respect to light emitted from the light-emitting layer 135. As an example, the reflection layer 150 is a metal layer formed mainly of Au. The reflection layer 150 is connected electrically with the interface electrode(s) 120. For the sake of improving light-extraction efficiency of the semiconductor light-emitting device 1, the reflection layer 150 may also be formed of a metal material such as Al, Au, Cu, and Ag, or an alloy material including at least one of these metal materials so far as such metal or alloy material has a predetermined or more reflectivity with respect to light emitted from the light-emitting layer 135.

The barrier layer 160 is formed of a conductive material connecting electrically with the reflection layer 150. As an example, the barrier layer 150 is a metal layer formed mainly of Pt. The barrier layer 160 suppresses diffusion of the material composing the support substrate side bonding layer 200 into the reflection layer 150, whereby deterioration in reflection characteristics of the reflection layer 150 is suppressed. The light-emitting structure side bonding layer 170 is formed of a conductive material having a predetermined thickness. The light-emitting structure side bonding layer 170 is connected electrically with the barrier layer 160. The light-emitting structure side bonding layer 170 can suppress oxidation in the boundary face between the light-emitting structure side bonding layer 170 and the support substrate side bonding layer 200; and for the sake of firm junction of the light-emitting structure side bonding layer 170 and the support substrate side bonding layer 200, as an example, the light-emitting structure side bonding layer 170 is formed mainly of Au.

Furthermore, the support substrate side bonding layer 200 is formed of the same material as that of the light-emitting structure side bonding layer 170 in order to achieve the same purpose as that of the light-emitting structure side bonding layer 170. The support substrate side bonding layer 200 is electrically and mechanically joined with the light-emitting structure side bonding layer 170. Specifically, the light-emitting structure side bonding layer 170 is bonded to the bonding layer on support substrate 200 by means of a thermal pressing method, whereby they are connected electrically and mechanically with each other. The light-emitting structure side bonding layer 170 and the support substrate side bonding layer 200 may also be formed of a metal material such as Au, Ag, and Al, or an alloy material including 80 wt % or more of at least one metal material among these metal materials, respectively. Thicknesses of the light-emitting structure side bonding layer 170 and the support substrate side bonding layer 200 are 0.5 μm or more to 2 μm or less, respectively.

The contact electrode 210 is formed of a conductive material to be in ohmic contact with the support substrate 20, and further which can suppress the diffusion of the material composing the support substrate 20 and the material composing the support substrate side bonding layer 200 one another. As an example, the contact electrode 210 is formed mainly of Ti, and connects electrically with the support substrate side bonding layer 200.

The support substrate 20 is formed of a material having a predetermined thermal conductivity and mechanical strength, and further conductivity. The support substrate 20 is formed, as an example, of a semiconductor material such as Si having a thickness of around 300 μm. In the case that the support substrate 20 is formed of a semiconductor material, the support substrate 20 is formed so as to have an electric resistivity of at least 0.1 Ω·cm or less in order to decrease the contact resistance value between the contact electrode 210 and the back electrode 220 formed on the support substrate 20 and the support substrate 20, and further to decrease the drive voltage of the semiconductor light-emitting device 1. The support substrate 20 may have of n-type or p-type conductivity so far as the support substrate 20 exhibits conductivity.

The back electrode 220 is connected electrically with the support substrate 20 in the surface opposite to the surface of the support surface 20 being in contact with the contact electrode 210. Specifically, the back electrode 220 is a metal electrode being in ohmic contact with the support substrate 20. As an example, the back electrode is formed of Ti and Au.

The semiconductor light-emitting device 1 may be mounted on a stem provided with a semiconductor light-emitting device loading section at a predetermined position, a first lead for insulating electrically the semiconductor light-emitting device loading section through an insulation section, and a second lead for connecting electrically with the semiconductor light-emitting device loading section. The stem is formed of a material including a metal material such as Cu, Al, and Fe exerting good conductivity, heat transfer characteristics, and mechanical characteristics. For instance, TO-18 stem, TO-46 or the like may be used as the stem, but the present embodiment is not limited thereto. For example, the semiconductor light-emitting device 1 of the first embodiment may also be loaded on a predetermined lead frame.

The semiconductor light-emitting device 1 is loaded on the semiconductor light-emitting device loading section of the stem through a conductive material such as an Ag paste, or a solder material such as AuSn. In view of improving mechanical strength, a material such as AuSn having a eutectic temperature higher than a curing temperature of a conductive adhesive such as an Ag paste may be used. Then, the pad electrode 100 of the semiconductor light-emitting device 1 is connected electrically with the first lead through an Au wire, whereby a predetermined electric power is supplied to the semiconductor light-emitting device 1 through the first and second leads so that the semiconductor light-emitting device 1 emits light.

The semiconductor light-emitting device 1 of the first embodiment having the above-described composition is a LED emitting a light having a red wavelength. For example, the semiconductor light-emitting device 1 is a red LED emitting a light having the peak wavelength in the vicinities of 630 nm in the case that the forward voltage is around 2 V, and the forward current is 20 mA.

FIG. 2A is a graph showing a relationship of light output with respect to area occupancy of the interface electrode in the first embodiment.

In this embodiment, the term "area occupancy of the interface electrode 120" means a ratio of a surface area of the surface of the semiconductor multilayer structure 130 being in contact with the interface electrode(s) (e.g. the surface of the p-type contact layer 139) with respect to a surface area of the interface electrode(s) 120 being in contact with the surface of the semiconductor multilayer structure 130. Among the lights emitted from the light-emitting layer 135, a part of the lights radiated on the side of the reflection layer 150 (reflection region) reaches the interface electrode(s) 120. The surfaces of the interface electrodes 120 are joined to the surface of the semiconductor multilayer structure 130 as a result of alloying; and the joined boundary face corresponds to an area having a lower reflectivity than that of the reflection layer 150. Consequently, a part of the lights reached to the joined boundary face is absorbed without reflecting toward the outside of the semiconductor light-emitting device. Thus, the interface electrodes 120 are formed such that the occupancy of the interface electrodes 120 is maintained at a predetermined value or less in order to suppress deterioration of the light output of the semiconductor light-emitting device 1.

FIG. 2A indicates changes of light output in the case that the occupancy of interface electrodes is changed variously in a semiconductor light-emitting device having the same composition as that of the semiconductor light-emitting device 1 of the first embodiment. In the case that an occupancy of the interface electrodes exceed 30% (for example, in case of 50% occupancy, a light output of the semiconductor light-emitting device is less than 2 mW, while any of the light outputs of the semiconductor light-emitting device is 2 mW or more in the case that an occupancy of the interface electrode(s) 120 is 30% or less. Particularly, a light output is 4 mW or more in the case that an occupancy of the interface electrode(s) 120 is 10% or less. Accordingly, an occupancy of the interface electrodes 120 is selected to be 30% or less, as an example, in the first embodiment in order to improve the light output and to reduce the drive voltage within a practical range. In this case, an occupancy of the interface electrodes 120 may also be selected to be 10% or less in order to improve further the light output of a semiconductor light-emitting device.

Figure 2B:
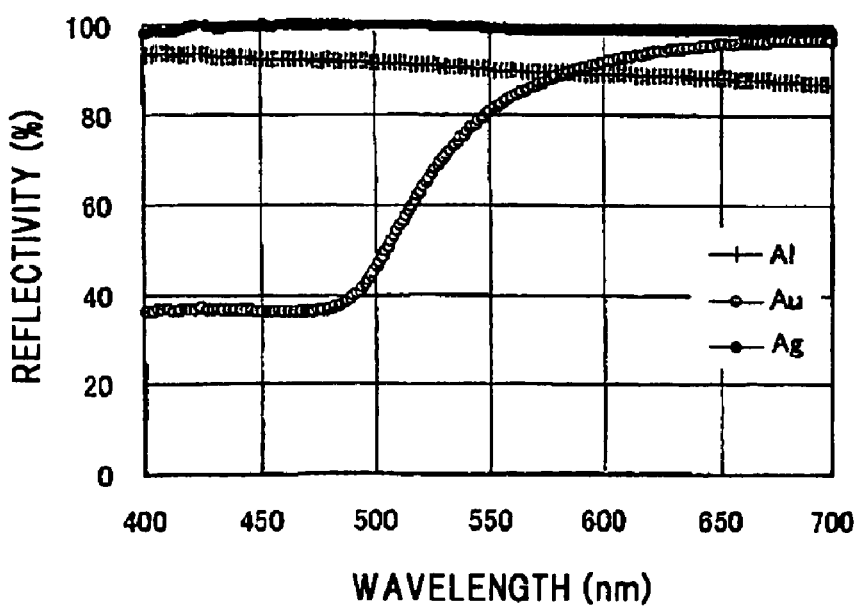
FIG. 2B is a graph showing a reflectivity of each material composing a reflection layer in the first embodiment.

FIG. 2B is a graph showing a reflectivity of each material composing the reflection layer of the first embodiment.

The reflection layer 150 is formed of a conductive metal material having a reflectivity of a predetermined value or more with respect to light emitted from the light-emitting layer 135. In the case that the reflection layer 150 is formed of Au, the reflection layer 150 has a reflectivity of about 90% or more with respect to a light having a wavelength of from 600 nm to 700 nm. Furthermore, in the case that the reflection layer 150 is formed of Al, the reflection layer 150 has a reflectivity of about 85% or more over a wavelength of from 400 nm to 700 nm. Besides, in the case that the reflection layer 150 is formed of Ag, the reflection layer 150 has a reflectivity of substantially 100% over a wavelength of from 400 nm to 700 nm.

Details of Thickness in Transparent Layer 140

Since the diffused reflection generating part 180 is included in a light extraction surface, the transparent layer 140 of the first embodiment is formed such a thickness that the interference due to multiple reflection of a light can be suppressed in order to radiate efficiently the light, which is input obliquely into a reflection region due to a change in a propagation direction in the diffused reflection generating part 180, toward outside the semiconductor light-emitting device 1. In this case, it is preferred that the transparent layer 140 is formed to have a thickness of a substantially half or more of a value obtained by dividing a center wavelength of light emitted from the light-emitting layer 135 by a refractive index of the transparent layer 140. The reason why such a thickness is to be specified is as follows.

First, a reflectivity R in the case that a transparent layer (the transparent layer 140 according to the present embodiment) having a lower refractive index than that of a semiconductor is provided in the boundary face between a metal film (the reflection layer 150 according to the present embodiment) and a semiconductor layer (the semiconductor multilayer structure 130 according to the present embodiment); and a light is input to a reflection region composed of the metal film and the transparent layer from the side of the semiconductor layer is represented by the following formula 1:

$$R = \left| \frac{r_1 + r_2 e^{i\delta}}{1 + r_1 r_2 e^{i\delta}} \right|^2$$

where δ is represented by the following formula 2:

$$\delta = \frac{4\pi \cdot d \sqrt{n_t^2 - n_s^2 \sin^2 \theta_i}}{\lambda}$$

where $n_t$ is a refractive index of a transparent material forming the transparent layer, $n_s$ is a refractive index of the semiconductor layer, d is a thickness of the transparent layer, $\theta_i$ is an incident angle of light, λ is a wavelength of light. Further, r1 and r2 are amplitude reflectivity in a transparent material boundary face and a metal layer boundary face, respectively, and the values are represented by the following formula 3 (S polarized light) and formula 4 (P polarized light).

$$r_{1,2} = \frac{\sqrt{N_{s,t}^2 - N_s^2 \sin^2 \theta_i} - \sqrt{N_{t,m}^2 - N_s^2 \sin^2 \theta_i}}{\sqrt{N_{s,t}^2 - N_s^2 \sin^2 \theta_i} + \sqrt{N_{t,m}^2 - N_s^2 \sin^2 \theta_i}}$$

$$r_{1,2} = \frac{N_{t,m}^2 \sqrt{N_{s,t}^2 - N_s^2 \sin^2 \theta_i} - N_{s,t}^2 \sqrt{N_{t,m}^2 - N_s^2 \sin^2 \theta_i}}{N_{t,m}^2 \sqrt{N_{s,t}^2 - N_s^2 \sin^2 \theta_i} + N_{s,t}^2 \sqrt{N_{t,m}^2 - N_s^2 \sin^2 \theta_i}}$$

where $N_s$, $N_t$, and $N_m$ are complex refractive indices of the semiconductor, the transparent material, and the metal, respectively. The formulae 1 through 4 are those with taking the interference of light into consideration; and these formulae are valid in the case that optical path length is shorter than coherence length.

Furthermore, when reflectivity in the reflection region of the S polarized light and P polarized light in the case that an incident angle is θ are represented by $R_s(\theta)$ and $R_p(\theta)$, an average reflectivity of light in the case that the incident angle ranges from 0° (vertical incidence) to θc is represented by the following formula 5:

$$R_{avr} = \frac{\int_0^{\theta_c} \sin\theta \cdot R_s(\theta) \, d\theta + \int_0^{\theta_c} \sin\theta \cdot R_p(\theta) \, d\theta}{2(1 - \cos\theta_c)}$$

Since the light input to the semiconductor multilayer structure 130 at an incident angle equal to or more than a critical angle of the semiconductor composing the semiconductor multilayer structure 130 with respect to media (air, a resin composing a resin mold and the like) outside the semiconductor light-emitting device 1 is reflected totally, the light is not discharged outside the semiconductor light-emitting device 1. In the case that a surface of the semiconductor multilayer structure 130 is in a smooth condition, even if the light input to the smooth surface repeats multiple reflection, the angle is scarcely changed. Hence, the light input to the semiconductor multilayer structure 130 at an incident angle equal to or more than a critical angle is absorbed in the semiconductor and/or the reflection region during repeating multiple reflection to discharge the light to the outside in the form of heat. Accordingly, such a reflectivity average value in the reflection region contributing to the improvement in light extraction efficiency in the case that the surface of the semiconductor multilayer structure 130 is smooth may be calculated, when a critical angle of the semiconductor with respect to the media outside the semiconductor and the semiconductor light-emitting device 1 is selected to, for example, the value of $\theta_c$ in the formula 5. Since the surface of the semiconductor multilayer structure 130 is smooth, an incident angle of the light input to the surface coincides substantially with that of the light input to the reflection region.

On the other hand, in the case that there is a structure producing diffused reflection on a surface of the semiconductor multilayer structure 130, the light input to the surface having a structure for producing diffused reflection (hereinafter referred optionally to "diffused reflection surface") is reflected at an angle different from the case where the surface to which a light is input is flat. In this case, a part of the lights input to the diffused reflection surface includes the light having an incident angle equal to or less than the critical angle of the semiconductor multilayer structure 130 and the semiconductor light-emitting device 1 with respect to the outside media. As a consequence, an amount of light discharged outside the semiconductor light-emitting device 1 from the semiconductor multilayer structure 130 increases in response to the number of times for repeating multiple reflection of light emitted omnidirectionaly from the light-emitting layer 135 between the diffused reflection surface of the semiconductor multilayer structure 130 and the reflection region. In such a case, it is required to consider that a value $\theta_c$ in the formula 5 is allowed to be up to 90° in respect of a reflectivity average value in the reflection region contributing to improvements in light-extraction efficiency.

Under the circumstances, an average reflectivity of a reflection region is calculated with respect to both the case that a surface of the semiconductor multilayer structure 130 is in a smooth condition ($\theta_c$: a critical angle of a resin mold with respect to the semiconductor multilayer structure 130) and that the surface of the semiconductor multilayer structure 130 is in a diffused reflection surface ($\theta_c$: 90°) in such condition that a refractive index of the semiconductor layer composing the semiconductor multilayer structure 130 is 3.2, a wavelength of light is 630 nm, a refractive index of a resin forming a resin mold as the media outside the semiconductor light-emitting device 1 is 1.45, and a metal composing the reflection layer 150 in the reflection region is Au, Ag, Cu, or Al.

Figures 3A, 3B:
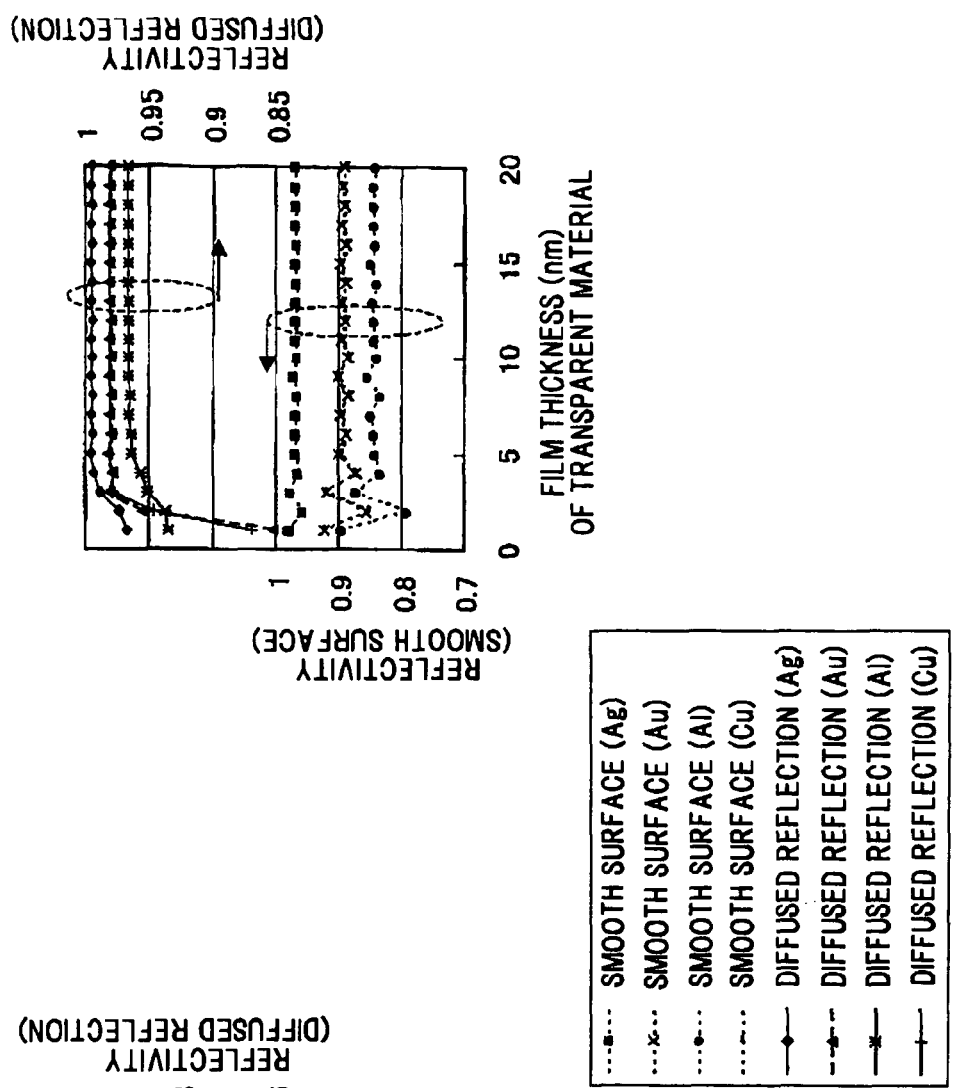
FIG. 3A is a graph showing calculation results of average reflectivity of a reflection region where the transparent layer is 1.45 in refractive index.
FIG. 3B is a graph showing calculation results of average reflectivity of the reflection region where the transparent layer is 2.0 in refractive index.

FIG. 3A is a graph showing calculation results of average reflectivity of the reflection region in the case that a refractive index of a transparent layer is 1.45. FIG. 3B is a graph showing calculation results of average reflectivity of the reflection region in the case that a refractive index of the transparent layer is 2.0.

First, referring to FIG. 3A, wherein it is understood that a reflectivity is the highest in the case that a thickness d of the transparent layer 140 is λ/(4 n) and when the surface of the semiconductor multilayer structure 130 is smooth, if the reflection layer 150 is formed of Au where n is a refractive index of a material composing the transparent layer 140 with respect to an emission wavelength (λ) of the light-emitting layer 135. On the other hand, when the surface of the semiconductor multilayer structure 130 has a diffused reflection surface, a thickness d of the transparent layer 140 becomes larger than the average reflectivity which is in λ/(4 n) in the case that the thickness d of the transparent layer 140 is λ/(2 n)

or more. Particularly, when the thickness d of the transparent layer 140 is $3\lambda/(4\,n)$ or more, the average reflectivity exhibits a saturation tendency.

Accordingly, it is understood that the transparent layer 140 of the first embodiment is preferably formed in thickness substantially half or more of the value obtained through a division of the center wavelength of light emitted from the light-emitting layer 135 by a refractive index of the transparent layer 140. More specifically, it is preferred that the transparent layer 140 is formed in thickness substantially ¾ or more of the value obtained through a division of the center wavelength of light emitted from the light-emitting layer 135 by a refractive index of the transparent layer 140 in the case that the transparent layer 140 has a refractive index of about 1.3 to about 3.0.

Furthermore, an average reflectivity of a reflection region is calculated with respect to both the case that a surface of the semiconductor multilayer structure 130 is in a smooth condition ($\theta_c$: a critical angle of a resin mold with respect to the semiconductor multilayer structure 130) and that the surface of the semiconductor multilayer structure 130 is in a diffused reflection surface ($\theta_c$: 90°) in such condition that a refractive index of the semiconductor layer composing the semiconductor multilayer structure 130 is 3.2, a wavelength of light is 630 nm, a refractive index of a resin forming a resin mold as the media outside the semiconductor light-emitting device 1 is 1.45, and a metal composing the reflection layer 150 in the reflection region is Au, Ag, Cu, or Al.

Referring to FIG. 3B, wherein it is understood that a reflectivity is the highest in the case that a thickness d of the transparent layer 140 is $\lambda/(4\,n)$ when the surface of the semiconductor multilayer structure 130 is smooth in any of the metals used for the calculation. On the other hand, when the surface of the semiconductor multilayer structure 130 has a diffused reflection surface, a thickness d of the transparent layer 140 becomes larger than the average reflectivity which is in $\lambda/(4\,n)$ in the case that the thickness d of the transparent layer 140 is $\lambda/(2\,n)$ or more. Particularly, when the thickness d of the transparent layer 140 is $3\lambda/(4\,n)$ or more, the average reflectivity exhibits a saturation tendency.

When summarized the above-described results, the following points become clear. Namely, it is found that an average reflectivity in the reflection region approaches gradually a value of the average reflectivity obtained in an incoherent optical system which does not consider the interference due to multiple reflection of light inside the transparent layer 140 with increase of a thickness of the transparent layer 140. This result can be qualitatively understood also in view of the fact that the interference effect in the transparent layer 140 decreases as a result of increase in thickness of the transparent layer 140. In the case that surfaces of the semiconductor multilayer structure 130 (both the surfaces on the side of light-extraction and the side of reflection region) are in a smooth condition, when a thickness of the transparent layer 140 is selected to be $\lambda/(4\,n)$, an average reflectivity increases due to interference effect as compared with an incoherent optical system. On one hand, it is found that when the surface of the semiconductor multilayer structure 130 has a diffused reflection surface, an average reflectivity becomes substantially the highest in the case that the transparent layer 140 is a coherent optical system.

Namely, in the case that a surface of the semiconductor multilayer structure 130 is smooth, when interference effect is allowed to appear in the transparent layer 140 in the vicinities of an incident angle of such a light which inputs perpendicularly to the reflection region, a value of average reflectivity in the reflection region can be improved. On the other hand, an average reflectivity is improved in the case that interference effect is not allowed to appear in the transparent layer 140 as much as possible, when the surface of the semiconductor multilayer structure 130 is not smooth. Thus, in the semiconductor light-emitting device 1 of the first embodiment, a thickness of the transparent layer 140 is specified such that the thickness is to be $\lambda/(2\,n)$ or more, i.e. due to this thickness, interference effect in the transparent layer 140 substantially decreases or disappears.

Modification of Semiconductor Light-Emitting Device 1

Although the semiconductor light-emitting device 1 of the first embodiment emits a light the emission wavelength of which is in red wavelength of 630 nm, the emission wavelength of the semiconductor light-emitting device 1 is not limited to this wavelength. In this connection, when a structure of the light-emitting layer 135 of the semiconductor multilayer structure 130 is controlled, the semiconductor light-emitting device 1 which emits lights within a predetermined range of wavelength (e.g. emission wavelength of approximately 560 nm to approximately 660 nm) may also be formed. Furthermore, the structure of the light-emitting layer 135 of the first embodiment may not be formed into the structure of a bulk layer, but may also be formed into a single quantum well, multiple quantum well, or distortion quantum well structure. In addition, the semiconductor multilayer structure 130 of the first embodiment may also be composed such that another layer (intermediate layer), a distributed Bragg reflector (DBR) layer and the like are further added to the above-mentioned compound semiconductor layer. The respective semiconductor layers composing the semiconductor multilayer structure 130 of the first embodiment is not limited to be formed of AlGaInP-based compound semiconductors, but they may also be formed of the other compound semiconductors such as GaAs-based, GaP-based, InP-based, AlGaAs-based, InGaP-based, and GaN-based compound semiconductors.

Furthermore, although the n-type compound semiconductor layers are positioned on the side of the pad electrode 100 in the semiconductor multilayer structure 130 of the first embodiment, the conductivity type of n-type and p-type may be inverted. Namely, in a modification, from the side of the pad electrode 100 toward the side of the reflection layer 150, the compound semiconductor layers may be formed in the order of the p-type contact layer 139, the p-type cladding layer 137, the light-emitting layer 135, the n-type cladding layer 133, and the n-type contact layer 131. In this case, the surface electrode 110 is formed of a material which makes to be ohmic contact with a n-type semiconductor, while the interface electrode(s) 120 is (are) formed of a material which makes to be ohmic contact with a p-type semiconductor.

Although the semiconductor light-emitting device 1 of the first embodiment is formed to have a top-to-bottom surface electrode structure wherein electric power is supplied from the side of the pad electrode 100 to that of the back electrode 220, a part of the p-type contact layer 139 in the compound semiconductor layer 130 is exposed, and a p-type electrode is provided on the exposed part, whereby a so-called top surface two-electrode structure may be formed in a modification. Namely, in the modification, a semiconductor multilayer structure 130 may be formed so as to have a semiconductor layer of at least first conductivity type and another semiconductor layer of a second conductivity type different from that of the first semiconductor layer, and to include the light-emitting layer 135 between the first conductivity type semiconductor layer (e.g. n-type cladding layer 133) and the second conductivity type semiconductor layer (e.g. the p-type cladding layer 137) wherein a part of the surface of the first conductivity type semiconductor layer on the side of the semiconductor multilayer structure 130 on which a light extraction surface is provided has a surface electrode 110 as the first electrode, while a part of the surface of the second conductivity type semiconductor layer has a second electrode.

The planar size of the semiconductor light-emitting device 1 is not limited to that mentioned in the above-described embodiments. For instance, the two-dimensional size of the semiconductor light-emitting device 1 may be designed so as to have substantially 350 nm in the vertical and horizontal dimensions, respectively. In addition, the vertical and horizontal dimensions may also be appropriately changed to form the semiconductor light-emitting device 1 in response to a use application thereof. Besides, a shape of the semiconductor light-emitting device 1 is not limited to a tetragon, but it may also be formed into a polygon (e.g. triangle, pentagon, . . . , N-gon: N is a positive integer).

The support substrate 20 may also be formed of a semiconductor substrate of Ge, GaP, GaAs, InP, GaN, SiC and the like materials; a metal plate formed of metal materials such as Cu, Fe, and Al being conductive materials; or an alloy plate formed of alloy materials such as Cu—W, and Cu—Mo. Furthermore, the support substrate 20 may also be formed of a metal material such as Cu, Al, W, Mo, C, and Ag; or an alloy material including 50 wt % or more of at least one metal material from these metal materials. In addition, the support substrate 20 may also be formed of a substrate having a multiple layer structure obtained by stacking a plurality of conductive materials in order to improve corrosion resistance of the support substrate, or to decrease a contact resistance between both the contact electrode 210 and back electrode 220, the support substrate 20.

Method of Making Semiconductor Light-Emitting Device 1

FIGS. 4A to 4K are schematic cross sectional views showing a process of making the semiconductor light-emitting device of the first embodiment.

Figure 4A:
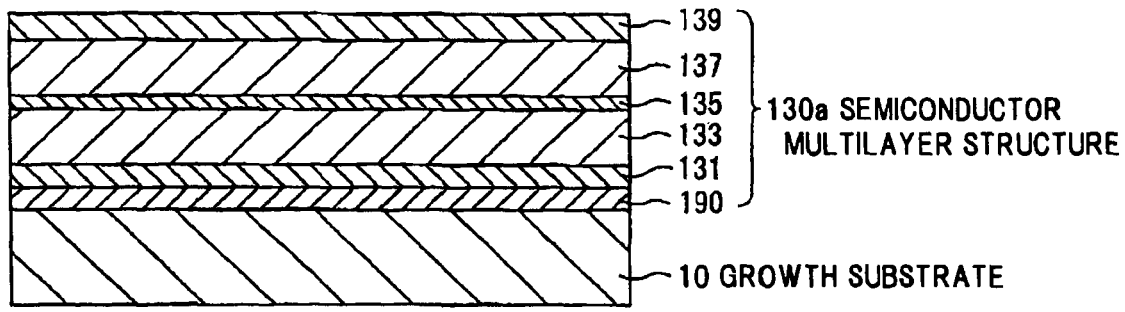

First, a semiconductor multilayer structure 130a being an epitaxial growth layer including a plurality of semiconductor layers is formed on a growth substrate 10 (as an example, a n-type GaAs substrate having 3 inch diameter is used) in accordance with, for example, MOVPE method as shown in FIG. 4A. The epitaxial growth of the semiconductor multilayer structure 130a of the present embodiment in accordance with MOVPE method may be practiced, as an example, such that a growth temperature for heating the growth substrate 10 is 650° C., a growth pressure is 50 Torr, respective epitaxial growth speeds for a plurality of semiconductor layers are from 0.3 nm to 1.0 nm/sec., and a V/III ratio is approximately 200. The V/III ratio means a ratio (quotient) in the case that the number of moles of group III raw materials such as TMGa, and TMAl is selected to be as a denominator, while a number of moles of group V raw materials such as $AsH_3$, and $PH_3$ is selected to be as a numerator.

Specifically, an etching stop layer 190, the n-type contact layer 131, the n-type cladding layer 133, the light-emitting layer 135, the p-type cladding layer 137, and the p-type contact layer 139 are epitaxially grown on the growth substrate 10 in this order. Consequently, an epitaxial wafer 3 wherein the semiconductor multilayer structure 130a including a plurality of epitaxial growth layers is formed on the growth substrate 10 is obtained.

After the formation of the semiconductor multilayer structure 130a according to MOVPE method, the epitaxial wafer 3 is taken out from the MOVPE apparatus. A transparent layer 140 having a predetermined thickness is formed on substantially the whole surface of the p-type contact layer 139 of the epitaxial wafer 3 on the surface opposite to the surface of the p-type contact layer 139 being in contact with the p-type cladding layer 137 by using a chemical vapor deposition (CVD) method, a plasma CVD method, a vacuum deposition method, a sputtering method or the like method. Specifically, the transparent layer 140 is formed such that a thickness d of the transparent layer 140 becomes $\lambda/(2n)$ or more, when a refractive index of a material composing the transparent layer 140 is n. The material forming the transparent layer 140 is, as an example, silicon dioxide.

Figure 4B:
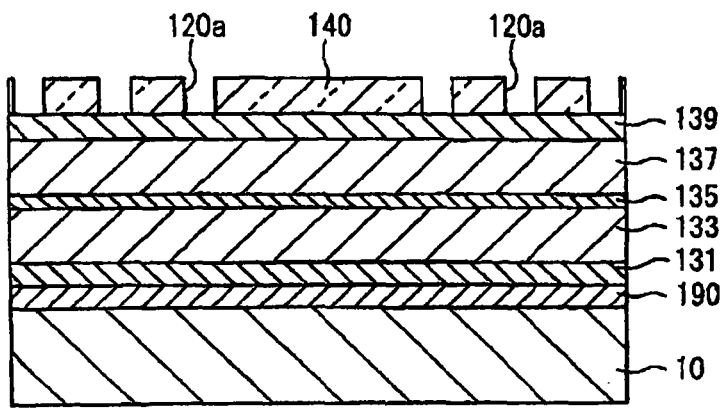

Then, a predetermined resist pattern is formed on the transparent layer 140 by using a photolithography method and an etching method, and as a consequence, openings 120a are formed on the transparent layer 140 as shown in FIG. 4B. In the case that the openings 120a are formed, and the transparent layer 140 is formed of $SiO_2$, the etching is implemented by the use of an etchant prepared by diluting hydrofluoric acid with pure water so as to have a predetermined concentration. Consequently, the surface of the p-type contact layer 139 is exposed through the openings 120a.

Figure 4C:
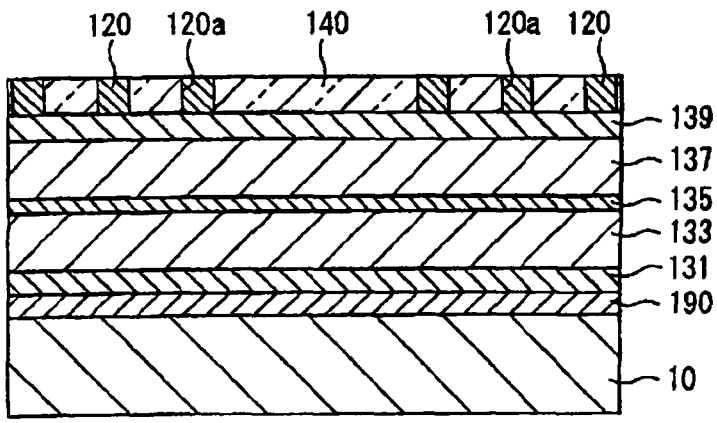

Next, a metal alloy material including AuZn (as an example, an AuZn alloy consisting of 95 wt % of Au and 5 wt % of Zn) is evaporated on the resist pattern and the openings 120a of the transparent layer 140 by applying a vacuum evaporation method, a sputtering method or the like methods. Successively, only the metal alloy material evaporated in the openings 120a is allowed to remain by applying a lift-off technology. Thus, the openings 120a formed in the transparent layer 140 are filled with the metal alloy material to form interface electrodes 120 as shown in FIG. 4C. The interface electrodes 120 are formed so as to have such a thickness around a thickness of the transparent layer 140 or thicker by from 10% to 20% for the sake of making positive the electrical connection with a reflection layer 150 to be formed on the transparent layer 140 and the interface electrodes 120 in the later process.

In succession, the reflection layer 150 (Au of 400 nm thickness as an example), a barrier layer 160 (Pt of 50 nm as an example), and a light-emitting structure side bonding layer 170 (Au of 500 nm thickness as an example) are formed on the interface electrodes 120 and the transparent layer 140 in this order by applying a vacuum evaporation method or a sputtering method as shown in FIG. 4D. The reflection layer 150, the barrier layer 160, and the light-emitting structure side bonding layer 170 may be formed continuously at one time in a vacuum evaporation apparatus or a sputtering apparatus. On one hand, the reflection layer 150, the barrier layer 160, and the light-emitting structure side bonding layer 170 may also be formed separately from one another in a vacuum evaporation apparatus or a sputtering apparatus. As a consequence, the light-emitting structure 5 formed of a multilayer structure composed mainly of compound semiconductors can be obtained.

Then, a contact layer 210 formed mainly of Ti having conductivity (Ti of 50 nm thickness as an example), and a support substrate side bonding layer 200 formed mainly of Au (Au of 500 nm thickness as an example) are formed on the surface of a Si substrate being a support substrate 20 in accordance with a vacuum evaporation method or a sputtering method, whereby a support structure 6 formed mainly with the support substrate 20 is obtained. As a Si substrate being the support substrate 20, a Si substrate having 3 inch diameter and p-type conductivity may be used as an example.

Successively, a junction surface 170a of the light-emitting structure side bonding layer 170 is superposed face-to-face to a junction surface 200a of the support substrate side bonding layer 200 of the support structure 6 as shown in FIG. 4E, and this condition is maintained by the use of a predetermined jig. Then, the jig keeping the superposed condition of the light-emitting structure 5 and the support structure 6 is introduced into a wafer boding apparatus. The inside of the wafer boding apparatus is maintained at a predetermined pressure (0.01 Torr as an example). Thereafter, a predetermined pressure (15 kgf/cm$^2$) is uniformly applied to the light-emitting structure 5 and the support structure 6 superposed one another through the jig. Then, the jig is heated up to a predetermined temperature (350° C. as an example) at a predetermined programming rate.

After the temperature of the jig reaches around 350° C., the jig is maintained at that temperature for a predetermined period of time (e.g. 30 minutes). Thereafter, the jig is cooled gradually, and the temperature of the jig is reduced sufficiently to, for example, room temperature. After the temperature of the jig is reduced, the pressure applied to the jig is released, and the pressure in the wafer bonding apparatus is equalized to the atmospheric pressure to take out the jig. As a result, the light-emitting structure 5 is bonded to the support structure 6 by means of thermocompression.

Namely, in the case that the thicknesses of the light-emitting structure side bonding layer 170 and the support substrate side bonding layer 200 are in a predetermined value or more, even if foreign matters exist in the boundary face of the surface of the light-emitting structure side bonding layer 170 and the surface of the support substrate side bonding layer 200 at the time of bonding them, the foreign matters are embedded in the light-emitting structure side bonding layer 170 and/or the support substrate side bonding layer 200, so that the light-emitting structure side bonding layer 170 and/or the support substrate side bonding layer 200 function(s) as a kind of a buffer layer for sustaining the junction in the boundary face between the light-emitting structure side bonding layer 170 and the support substrate side bonding layer 200. As a consequence, generation of voids being a part of bad junction due to the foreign matters existing in the boundary face between the light-emitting structure side bonding layer 170 and the support substrate side bonding layer 200 can be suppressed.

Accordingly, the thicknesses of the light-emitting structure side bonding layer 170 and the support substrate side bonding layer 200 are formed in a predetermined value or more, i.e. 0.5 μm or more as an example in the present embodiment in order to produce the semiconductor light-emitting device 1 wherein the generation of voids is suppressed at a good yield ratio. On the other hand, for the sake of preventing the increase in cost of raw materials of the light-emitting structure side bonding layer 170 and the support substrate side bonding layer 200, the thicknesses of the light-emitting structure side bonding layer 170 and the support substrate side bonding layer 200 are formed in a predetermined value or less. Namely, although the more improvements in effects of suppressing generation of voids are expected with the thicker thicknesses of the light-emitting structure side bonding layer 170 and the support substrate side bonding layer 200, the cost of raw materials increases in response to the increase of the thicknesses. Accordingly, the light-emitting structure side bonding layer 170 and the support substrate side bonding layer 200 are formed while maintaining the thicknesses of the light-emitting structure side bonding layer 170 and the support substrate side bonding layer 200 within a range by which the semiconductor light-emitting device 1 can be obtained at a good yield ratio (2.0 μm as an example) or less.

Figure 4F:
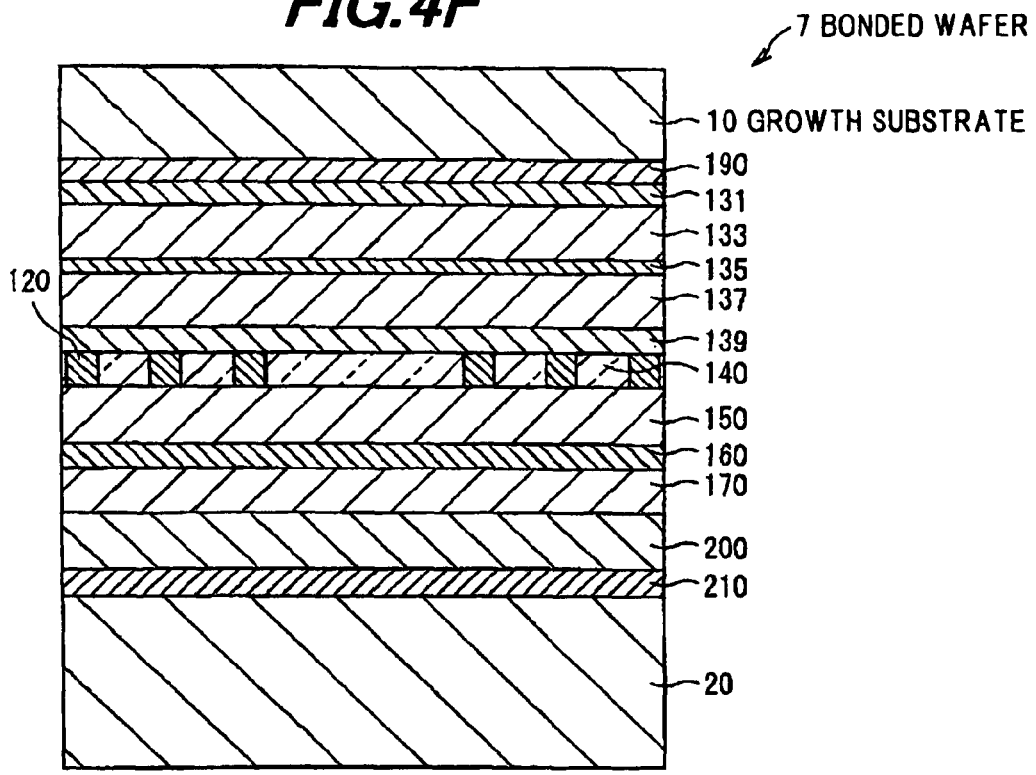

As a result, a bonded wafer 7 wherein the light-emitting structure 5 and the support structure 6 are mechanically and electrically joined between the light-emitting structure side bonding layer 170 and the support substrate side bonding layer 200 is formed as shown in FIG. 4F. In the present embodiment, the light-emitting structure 5 includes the barrier layer 160 so that deformation of the reflection layer 150 due to the pressure and the like at the time of bonding the reflection layer can be suppressed even when the light-emitting structure 5 is joined to the support structure 6. Furthermore, the barrier layer 160 suppresses to diffuse the materials for forming the light-emitting structure side bonding layer 170 and the support substrate side bonding layer 200 into the reflection layer 150 due to the pressure/heat at the time of bonding them, whereby deterioration of reflection characteristics of the reflection layer 150 is suppressed.

Next, the bonded wafer 7 is bonded to a polishing support plate formed of a ceramics or the like having a predetermined mechanical strength by means of a predetermined bonding wax. A growth substrate 10 is polished until a predetermined thickness thereof, for example, about 30 μm is obtained. Successively, the bonded wafer 7 after being polished is removed from the polishing support plate; and the wax adhered on the surface of the support substrate 20 of the bonded wafer 7 is washed and removed.

Figure 4G:
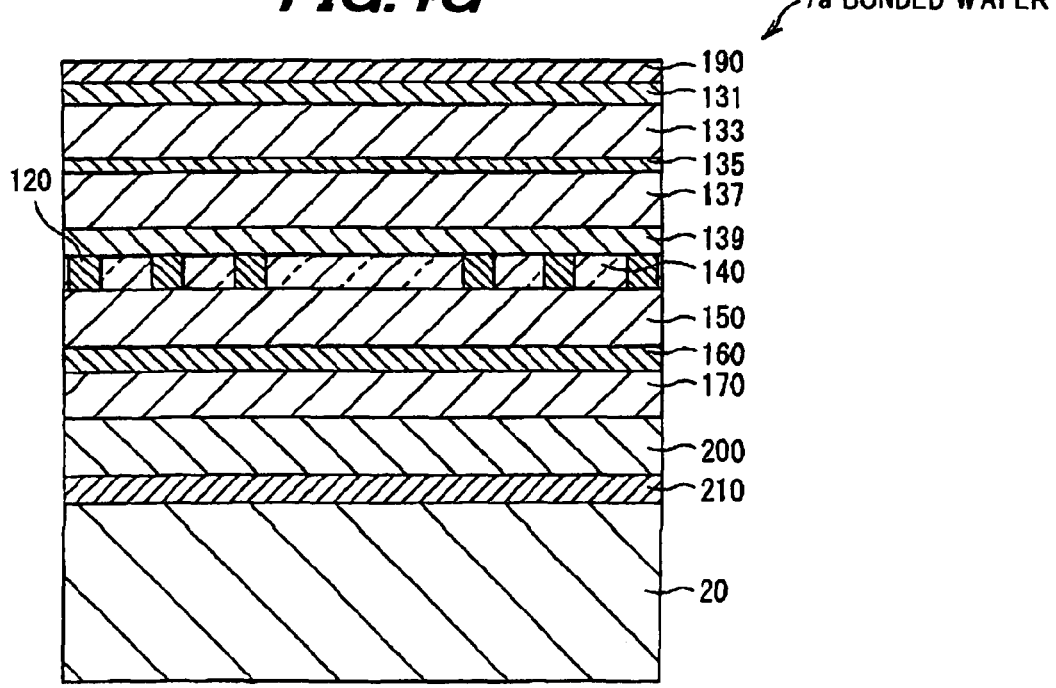

The bonded wafer 7 after being polished is etched by the use of a predetermined etchant as shown in FIG. 4G. In the case that the growth substrate 10 is GaAs substrate, a mixed etchant prepared by admixing aqueous ammonia and hydrogen peroxide solution at a predetermined ratio, as an example, may be used as the predetermined etchant. The growth substrate 10 is selectively and completely removed from the bonded wafer 7 to form a bonded wafer 7a the etching stop layer 190 thereof is exposed. Alternatively, the growth substrate 10 may be removed by applying only the etching step without applying a polishing step.

Figure 4H:
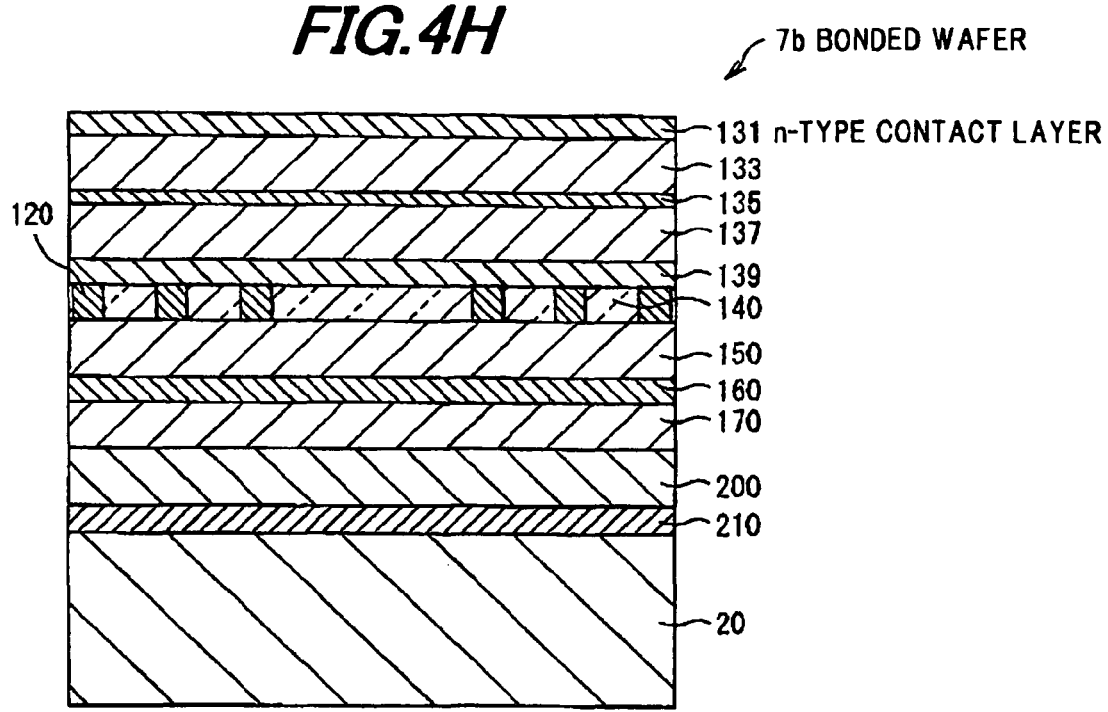

Next, the etching stop layer 190 is removed by wet etching, whereby the n-type contact layer 131 is exposed as shown in FIG. 4H. When the etching stop layer 190 is formed of, for example, n-type $(Al_{0.7}Ga_{0.3})_{0.5}In_{0.5}P$, hydrochloric acid may be used as the etchant for removing the etching stop layer 190.

Figure 4I:
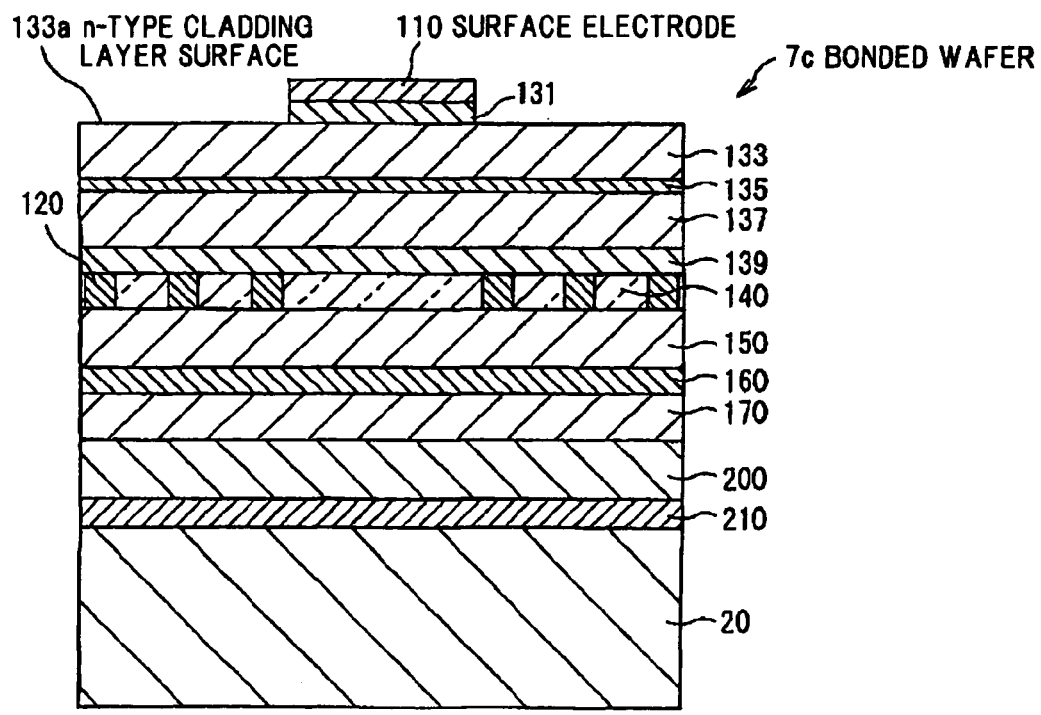

Next, a surface electrode 110 is formed on the surface of the exposed n-type contact layer 131 by using a photolithography method. The surface electrode 110 is formed, as an example, by evaporating a gold-germanium alloy (AuGe) of 50 nm thickness, Ni of 10 nm thickness, and Au of 300 nm thickness in this order from the side of the n-type contact layer 131. The formed surface electrode 110 is used as a mask to selectively etch the n-type contact layer 131 except for directly under the surface electrode 110. Consequently, a bonded wafer 7c wherein the surface of the n-type cladding layer 133 (n-type cladding layer surface 133a) is exposed is obtained as shown in FIG. 4I. In the case that the n-type contact layer 131 is a GaAs-based semiconductor layer, and the n-type cladding layer 133 is a AlGaInP-based semiconductor layer, the n-type contact layer 131 may be selectively etched by the use of, as an example, a mixed etchant prepared by admixing sulfuric acid, hydrogen peroxide solution, and water at a predetermined ratio.

Next, a periodical dot pattern made of a photoresist having 1 μm diameter is formed on the surface of a n-type $(Al_{0.7}Ga_{0.3})_{0.5}In_{0.5}P$ cladding layer being the n-type cladding layer 133 by applying a photolithography method. A pitch of the respective dots is set to 2 μm, and further the respective dots are positioned in a square lattice-shape. In succession, the bonded wafer 7c including the n-type cladding layer 133 on which the photoresist pattern having dot-shaped openings is formed is dipped into an etchant prepared by admixing hydrochloric acid and pure water at a predetermined ratio (for example, dipped for about 30 seconds).

Figure 4J:
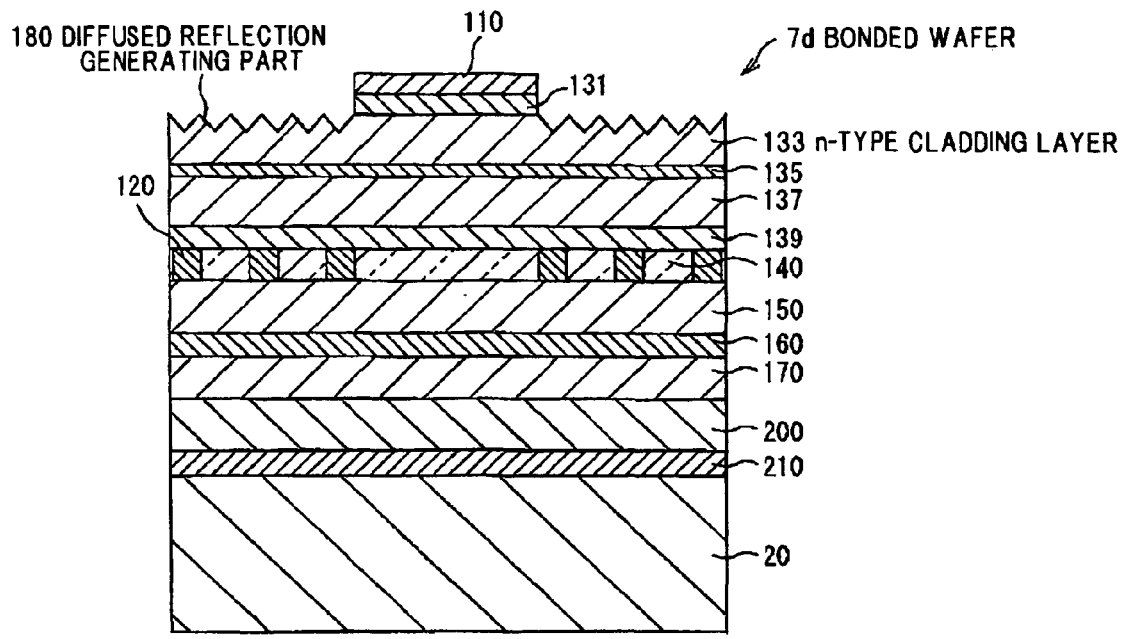

As a result of the dipping, roughening of the n-type cladding layer 133 having the dot-shaped openings is conducted. A depth etched as a result of roughening is about 1 μm at the deepest portion. As a consequence of the roughening, a diffused reflection generating part 180 being a unsmooth surface producing diffused reflection on the surface being a light extraction surface of the semiconductor multilayer structure 130 is formed as shown in FIG. 4J. In the diffused reflection generating part 180, arithmetic average roughness is substantially ¼ or more of a wavelength of light emitted from the light-emitting layer 135; and the diffused reflection generating part 180 has a unsmooth surface at an angle which is not zero of at least one angle defined by a normal of the average surface of light-extraction surfaces and a normal of the surface of the light-extraction surface. Namely, when a boundary face between the n-type cladding layer 133 and the light-emitting layer 135 is made to be a reference plane, the diffused reflection generating part 180 has a region including a normal directing to a direction which is not in parallel to the normal of the reference plane. In other words, the light-extraction surface includes a plurality of regions; and at least a part of the plurality of regions inclines with respect to the normal of the reference plane.

Successively, the photoresist pattern is removed by washing with use of an organic solvent. As a consequence, a bonded wafer 7d having the diffused reflection generating part 180 is obtained as shown in FIG. 4J.

Next, a back electrode 220 is formed on the surface opposite to the surface of the support substrate 20 on which the contact layer 210 is formed. The back electrode 220 is formed by evaporating Ti as an example (100 nm thickness as an example) and Au (400 nm thickness as an example) in this order on substantially whole the surface opposite to the surface of the support substrate 20 on which the contact layer 210 is formed. The back electrode 220 may be formed, for example, by a vacuum evaporation method, a sputtering method or the like method.

After forming the surface electrode 110 and the back electrode 220, the bonded wafer 7d on which the surface electrode 110 and the back electrode 220 are formed is carried in an alloy apparatus. The alloy apparatus is that for conducting an alloying treatment wherein the alloying treatment is carried out under a predetermined atmosphere at a predetermined temperature for a predetermined period of time. The alloy apparatus according to the present embodiment is provided with, for example, a plurality of independent heaters (an upper heater and a lower heater) in the vertical direction along the gravitational direction, and a tray made of graphite for loading a wafer wherein the lower heater has a lower plate for installing the tray.

In the present embodiment, the bonded wafer 7d on which the surface electrode 110 and the back electrode 220 are formed is heated, as an example, in nitrogen gas atmosphere being an inert atmosphere at a predetermined temperature, and further a heat treatment is conducted at that temperature for a predetermined period of time. In this case, a temperature and a time for the heat treatment are set in order to establish ohmic contacts between the surface electrode 110 and the n-type contact layer 131, between the interface electrodes 120 and the p-type contact layer 139, between the contact electrode 210 and the support substrate 20, and between the back electrode 220 and the support substrate 20, respectively. The alloying treatment is implemented, as an example, in nitrogen atmosphere by raising the temperature up to 400° C., and maintaining the bonded wafer 7d on which the surface electrode 110 and the back electrode 220 are formed at 400° C. for five minutes.

Then, a pad electrode 100 is formed on an area which corresponds to substantially the central part of the surface electrode 110 of the bonded wafer 7d. As an example, the pad electrode has a circular shape of 100 μm diameter; and the shape thereof coincides substantially with a circular part of the substantially central part of the surface electrode 110. The pad electrode 100 is obtained by forming, as an example, Ti (50 nm thickness as an example), and Au (1000 nm thickness as an example) in this order from the side of the surface electrode 110.

Figure 4K:
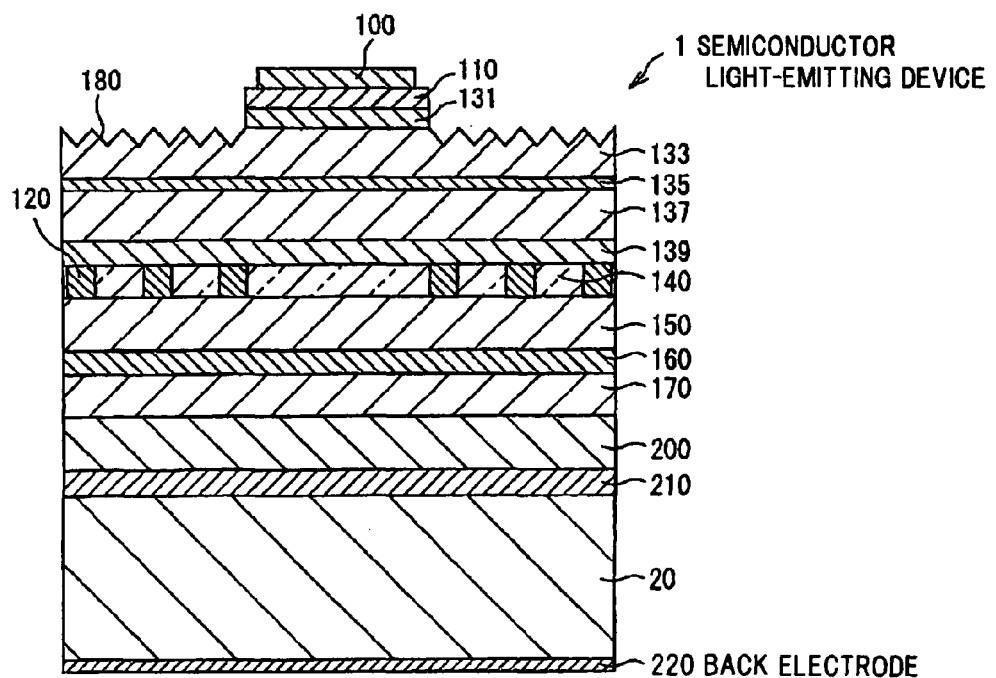

Next, such a position that the circular part of the surface electrode 110 is disposed at substantially the midst when viewed from the top surface is specified, and the bonded wafer 7d provided with the pad electrode 100 is cut away with a dicing device, whereby a plurality of the semiconductor light-emitting devices 1 is formed. Thus, the semiconductor light-emitting device 1 provided with a diffused reflection generating part 180 formed by roughening the surface of the n-type cladding layer 133 exposed to the outside as shown in FIG. 4K is obtained. After forming the pad electrode 100, an alloying treatment is not applied to the bonded wafer 7d and the semiconductor light-emitting device 1.

In the case that the bonded wafer 7d is separated into a plurality of semiconductor light-emitting devices 1, the plurality of device structures may be separated by means of a mesa-separation process wherein an etching treatment or a half-dice is used. The bonded wafer 7d to which a mesa-separation process has been applied may be subjected to a dicing treatment to form a plurality of the semiconductor light-emitting devices 1.

Effects of the First Embodiment

According to the semiconductor light-emitting device 1 of the present embodiment, the light-extraction surface is roughened, and further a thickness of the transparent layer 140 disposed between the light-emitting structure 6 and the support structure 5 is controlled, whereby the interference due to multiple reflection of the light input to the transparent layer 140 can be reduced. As a consequence, the lights reflected by the roughened light-extraction surface; and even the lights input obliquely to a reflection region composed of the transparent layer 140 and the reflection layer 150 exhibit such improved provability that they are reflected in the direction through which they are radiated outside the light-emitting device 1, so that the light-extraction efficiency of the semiconductor light-emitting device 1 can be improved.

Second Embodiment

Figure 5:
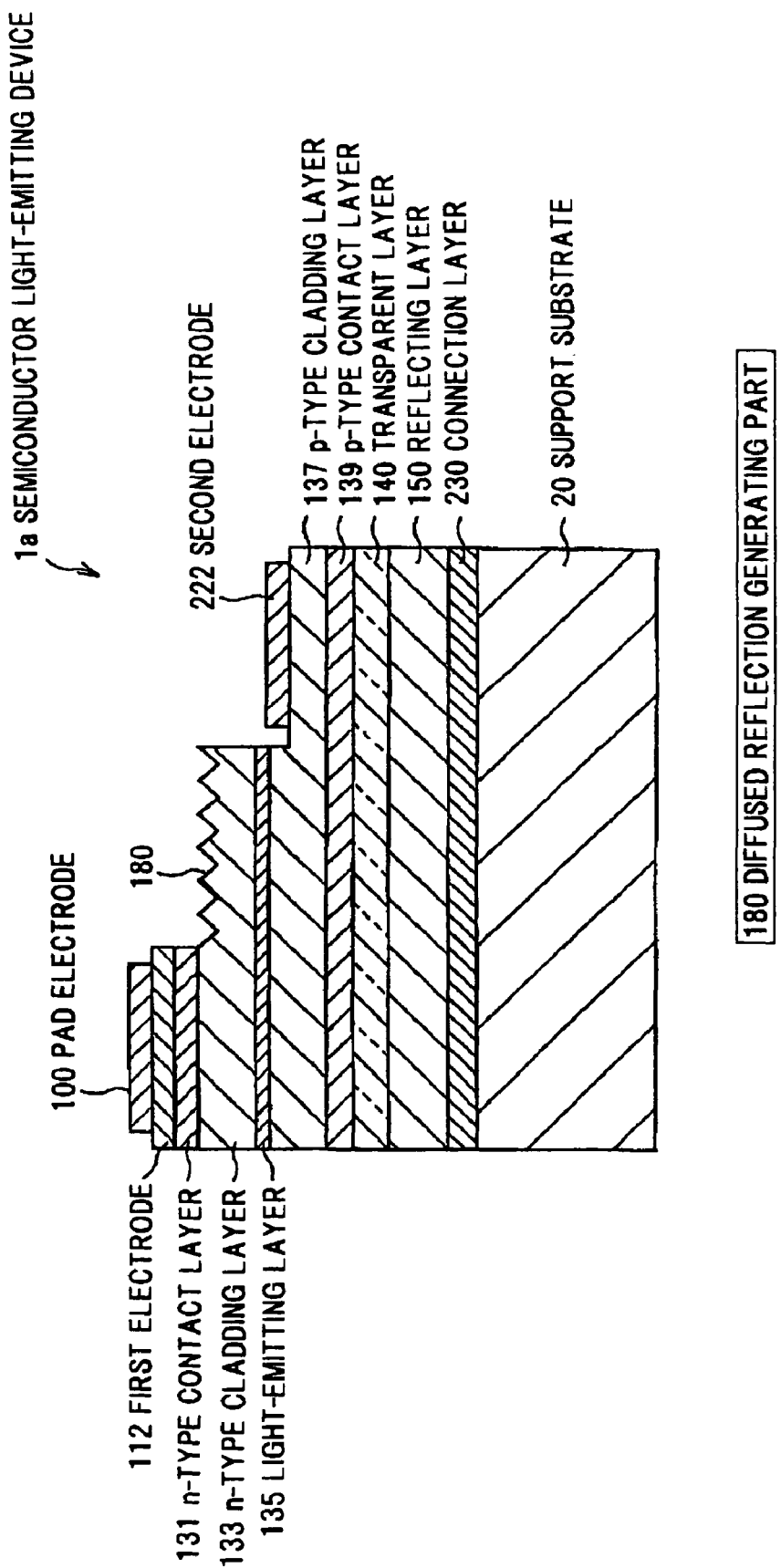
FIG. 5 is a schematic cross sectional view showing a semiconductor light-emitting device in a second preferred embodiment of the invention.

FIG. 5 is a schematic cross sectional view showing a semiconductor light-emitting device in the second embodiment of the invention.

The semiconductor light-emitting device 1 of the first embodiment is formed to have a top and bottom surface electrode structure wherein electric power is supplied from the side of the pad electrode 100 toward the back electrode 220. On the other hand, a semiconductor light-emitting device 1a of the second embodiment has substantially the same composition as that of the semiconductor light-emitting device 1 of the first embodiment except that a part of a p-type cladding layer 137 of a compound semiconductor layer 130 is exposed, and a p-type electrode is provided on the exposed portion to have a so-called top surface two-electrode structure. Accordingly, the detailed description therefor is omitted excluding different points.

Structure of Semiconductor Light-Emitting Device 1a The semiconductor light-emitting device 1a of the second embodiment is provided with the semiconductor multilayer structure 130 comprising a light-emitting layer 135, a first electrode 112 as an n-type electrode which is electrically connected with a part of one of the surface of the semiconductor multilayer structure 130, and the pad electrode disposed on the first electrode 112. Furthermore, the semiconductor light-emitting device 1a is provided with a transparent layer 140 covering the other surface opposite to the above-described one surface of the semiconductor multilayer structure 130, and a reflection layer 150 disposed on the side opposite to the surface of the transparent layer 140 being in contact with the other surface of the semiconductor multilayer structure 130 wherein a reflection region is composed of the transparent layer 140 and the reflection layer 150. The semiconductor light-emitting device 1a is provided with a connection layer 230 disposed on the side opposite to the surface of the reflection layer 140 being in contact with the transparent layer 140, and a support substrate 20 connecting with the reflection layer 140 through the connection layer 230.

The semiconductor multilayer structure 130 of the second embodiment has a p-type contact layer 139 disposed on the position being in contact with the transparent layer 140, a p-type cladding layer 137 disposed on the surface of the side opposite to the surface of the p-type contact layer 139 being in contact with the transparent layer 140, the light-emitting layer 135 disposed on the surface opposite to the side of the surface of the p-type cladding layer 137 being in contact with p-type contact layer 139, a n-type cladding layer 133 disposed on the surface of the side opposite to the surface of the light-emitting layer 135 being in contact with the p-type cladding layer 137, and a n-type contact layer disposed on the surface of the side opposite to the surface of the n-type cladding layer 133 being in contact with the light-emitting layer 135. In a semiconductor light-emitting device in a modification of the second embodiment, the semiconductor multilayer structure 130 may also be formed to have not the p-type contact layer 139.

A part of the p-type cladding layer 137 is exposed to the outside; and on the exposed p-type cladding layer 137, a second electrode as a p-type electrode which is ohmic-connected with the p-type cladding layer 137 is provided. Furthermore, the n-type cladding layer 133 has a light-extraction surface including a diffused reflection generating part 180 which reflects diffusely a part of the lights emitted from the light-emitting layer 135 on the side of the surface opposite the surface being in contact with the light-emitting layer 135. Since the diffused reflection generating part 180 has substantially the same functions and operations as that of the diffused reflection generating part 180 of the first embodiment, the detailed explanation therefor is omitted. The connection layer 230 is formed of, for example, Au having a predetermined thickness. The connection layer 230 may be separately provided both on the reflection layer 150 and on the support substrate 20. In this case, the connection layer 230 is integrated by thermocompression between a part of the connection layer 230 on the support substrate 20 and a part of the connection layer 230 on the reflection layer 150.

In the second embodiment, the support substrate 20 is not necessarily formed of a material having conductivity. Namely, the support substrate 20 of the second embodiment may be formed of a high-resistance material having an electric resistivity of, for example, 10 Ω·cm or higher; or an insulating substrate, as an example, such as glass substrate, and sapphire substrate. An Example of the high-resistance material includes GaAs, Si, Ge, GaP, InP, SiC, GaN, $SiO_2$, $Al_2O_3$, AlN, MgO or ZnO having 10 Ω·cm or higher electric resistivity.

The semiconductor light-emitting device 1a of the second embodiment is basically provided with the support substrate 20, the connection layer 230 disposed above one of the surfaces of the support substrate 20, a reflection region joining to the connection layer 230, the light-emitting layer 135 disposed on the opposite side of the reflection region with respect to the connection layer 230 and emits the light having a predetermined wavelength, and the semiconductor multilayer structure 130 including the light-extraction surface which reflects diffusely the lights emitted from the light-emitting layer 135 disposed on the opposite side of the light-emitting layer 135 with respect to the reflection region; the reflection region includes the transparent layer 140 made of a material having a lower refractive index than that of the semiconductor multilayer structure 130, and the reflection layer 150 made of a metal material; the transparent layer 140 has a thickness by which the interference due to multiple reflection of the lights input to the transparent layer 140 is suppressed; further, the semiconductor multilayer structure 130 includes the light-emitting layer 135 between the n-type cladding layer 133 being a semiconductor layer of a first conductive type, and the p-type cladding layer 137 being a semiconductor layer of a second conductive type different from that of the first conductive type; and the semiconductor multilayer structure 130 has the first electrode 112 on a part of the surface of the semiconductor layer of the first conductive type on the side on which the light-extraction surface is provided, and the second electrode 222 on a part of the surface of the semiconductor layer of the second conductive type.

Effects of the Second Embodiment

The semiconductor light-emitting device 1a of the second embodiment is different from the first embodiment in that no interface electrode(s) 120 is (are) provided, so that an occupancy of the interface electrode(s) 120 may be made to be zero in the reflection region. As a consequence, the semiconductor light-emitting device 1a of the second embodiment can improve the light-extraction efficiency.

Example 1

A semiconductor light-emitting device according to Example 1 of the invention is produced in accordance with a method of making the semiconductor light-emitting device 1 as described in the first embodiment of the invention. Specifically, a semiconductor light-emitting device having the following composition is produced as the semiconductor light-emitting device of Example 1.

Namely, a semiconductor multilayer structure 130a of the semiconductor light-emitting device according to Example 1 is produced from the side of a n-type GaAs substrate (3 inch diameter) being the growth substrate 10 in accordance with a MOVPE method in the following order, i.e. a n-type $(Al_{0.7}Ga_{0.3})_{0.5}In_{0.5}P$ etching stop layer (Si-doped, 200 nm thickness, $1 \times 10^{18}/cm^3$ carrier concentration), a n-type GaAs contact layer (Si-doped, 100 nm thickness, $1 \times 10^{18}/cm^3$ carrier concentration), a n-type $(Al_{0.7}Ga_{0.3})_{0.5}In_{0.5}P$ cladding layer (Si-doped, 2000 nm thickness, $1 \times 10^{18}/cm^3$ carrier concentration), an undoped $(Al_{0.1}Ga_{0.9})_{0.5}In_{0.5}P$ light-emitting layer (300 nm thickness), a p-type $(Al_{0.7}Ga_{0.3})_{0.5}In_{0.5}P$ cladding layer (Mg-doped, 400 nm thickness, $1.2 \times 10^{18}/cm^3$ carrier concentration), and a p-type GaP contact layer (Mg-doped, 100 nm thickness, $1\times10^{18}/cm^3$ carrier concentration). From the resulting semiconductor multilayer structure 130a, a plurality of epitaxial wafers 3 according to Example 1 is produced.

A transparent layer 140 being a part of the reflection region to be formed in the epitaxial wafer is formed of $SiO_2$. In Example 1, the total six types of semiconductor light-emitting devices each provided with a transparent layer 140 ($SiO_2$ film) having a different thickness from one another are produced. Namely, six types of semiconductor light-emitting devices including transparent layers 140 having six types of thicknesses of 220 nm, 330 nm, 440 nm, 550 nm, 660 nm, and 770 nm are produced. The respective film thicknesses of these transparent layers 140 are set to values corresponding to the multiple numbers of a reference $d=\lambda/(4\times n)$, i.e. $d=2\lambda/(4\times n)$, $d=3\lambda/(4\times n)$, $d=4\lambda/(4\times n)$, $d=5\lambda/(4\times n)$, $d=6\lambda/(4\times n)$, and $d=7\lambda/(4\times n)$, respectively, where d is a film thickness of $SiO_2$, $\lambda$ is a light emission peak wavelength of a semiconductor light-emitting device (630 nm in Example 1), and n is a refractive index of the transparent layer 140 with respect to a light emission wavelength of a semiconductor light-emitting device (i.e. a refractive index of $SiO_2$) (1.45 in case of $SiO_2$).

The interface electrode 120 has a thickness of the same degree as that of each of the transparent layer 140 in each of the six types of semiconductor light-emitting devices. An AuZn alloy (Au: 95 wt %, Zn: 5 wt %) is used as a material for composing the interface electrode 120. The layout as described in FIGS. 1B(a) and 1B(b) is applied to the interface electrodes 120 (15 μm diameter) in Example 1. Furthermore, a light-emitting structure 5 is obtained by forming 400 nm thickness Au being a reflection layer 150 as a part of the reflection region, 50 nm thickness Pt as a barrier layer 160, and 500 nm thickness Au as a light-emitting structure side bonding layer 170. On one hand, a p-type substrate (3 inch diameter) is used as a support substrate 20, and 50 nm thickness Ti and 500 nm thickness Au are formed on the Si substrate to obtain a support structure 6.

The light-emitting structure 5 is bonded to the support structure 6 by means of a thermocompression bonding as described in the first embodiment, and the production method as described in the embodiment is applied to the bonded structures, whereby a semiconductor light-emitting device provided with the diffused reflection generating part 180 according to Example 1 is produced. A back electrode 220 is formed of 100 nm thickness Ti and 400 nm thickness Au. A pad electrode 100 is formed of 50 nm thickness Ti and 1000 nm thickness Au.

Comparative Example

A semiconductor light-emitting device according to Comparative Example is produced in accordance with the same manner as Example 1 except that a thickness of the transparent layer 140 is 110 nm, and accordingly, the detailed explanation therefor is omitted. The thickness of the transparent layer 140 of the semiconductor light-emitting device in Comparative Example is set to a value calculated from $d=\lambda/(4\times n)$ being the reference in Example 1.

Characteristic evaluation in light emission of the semiconductor light-emitting devices in Example 1 and Comparative Example is implemented by such a manner that the semiconductor light-emitting devices are mounted on a TO-18 stem by die-bonding and wire bonding, and they are energized at 20 mA. Namely, initial characteristic of the semiconductor light-emitting devices is evaluated in a so-called bear chip condition in Example 1 and Comparative Example. Concerning both the semiconductor light-emitting devices in Example 1 and Comparative Example, the expression "not roughened" means the characteristic in a condition before a diffused reflection generating part 180 is formed by roughening, while the expression "roughened" means the characteristic in a condition after the diffused reflection generating part 180 is formed by roughening.

Table 1 indicates the results of characteristic evaluation of the semiconductor light-emitting devices in Example 1 and Comparative Example.

TABLE 1

|  | $SiO_2$ film thickness (nm) | Not roughened | | Roughened | | Output ratio after roughened (vs. 110 nm) |
|---|---|---|---|---|---|---|
|  |  | Light output (mW) | Drive voltage (V) | Light output (mW) | Drive voltage (V) |  |
| Comparative Example | 110 | 3.95 | 2.02 | 6.68 | 2.04 | 1.00 |
| Example 1 | 220 | 3.43 | 2.01 | 6.86 | 2.04 | 1.03 |
|  | 330 | 3.86 | 2.01 | 7.53 | 2.03 | 1.13 |
|  | 440 | 3.62 | 2.02 | 7.49 | 2.04 | 1.12 |
|  | 550 | 3.83 | 2.03 | 7.66 | 2.05 | 1.15 |
|  | 660 | 3.62 | 2.01 | 7.74 | 2.02 | 1.16 |
|  | 770 | 3.73 | 2.02 | 7.66 | 2.04 | 1.15 |

(Evaluation at 20 mA)

Referring to Table 1, the characteristic at 20 mA of the semiconductor light-emitting device in Comparative Example is such that the light output is 3.95 mW, and the forward drive voltage is 2.02 V in case of not roughened condition, while such that the light output is 6.68 mW, and the forward drive voltage is 2.04 V in case of a roughened condition. Namely, when the case that a diffused reflection generating part 180 is not formed on the surface of the n-type cladding layer 133 (n-type $(Al_{0.7}Ga_{0.3})_{0.5}In_{0.5}P$ cladding layer) having a light-extraction surface is compared with the case that the diffused reflection generating part 180 is formed by roughening, it is confirmed that the light output is improved by about 1.7 times higher.

Further referring to Table 1, when a film thickness of the transparent layer 140 formed of $SiO_2$ being a transparent material is thickened, an output magnification of light output of the semiconductor light-emitting device according to Example 1 (a ratio of light output of the semiconductor light-emitting device according to Example 1 with respect to the light output in the case that a thickness of the transparent layer 140 is 110 nm) increases gradually after roughening the semiconductor light-emitting device. It is shown also as to the absolute value of light output that it is possible to make higher than that of Comparative Example (film thickness of the transparent layer: 110 nm) in the case that a film thickness of the transparent layer 140 becomes 220 nm or more.

As described above, the light output is improved in Example 1 with the increase of the film thickness of the transparent layer 140. The result is considered to exemplify as explained in FIG. 3A such fact that when a film thickness of the transparent layer 140 is thickened, an average reflectivity in the reflection region is improved so that improvements in light output of a semiconductor light-emitting device are brought about due to the improvements in the average reflectivity.

Example 2

The semiconductor light-emitting device according to Example 2 has substantially the same composition as Example 1 except that the shape and layout of the surface electrode 110 and the interface electrode(s) 120 of Example 1 differ from Example 2, so that the detailed explanation therefor is omitted excluding the differences thereof.

Figure 6:
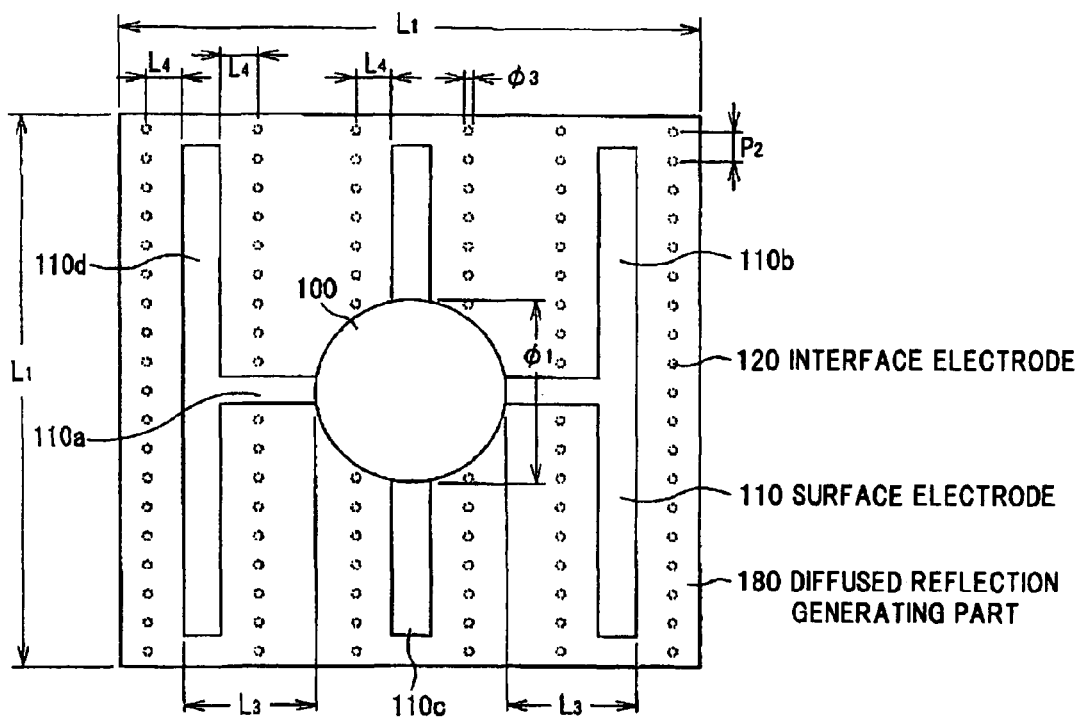
FIG. 6 is a top view showing a layout of a surface electrode and an interface electrode in Example 2 of the invention.

FIG. 6 is a top view showing a layout of the surface electrode and interface electrodes according to Example 2 of the invention.

As shown in FIG. 6, the surface electrode 110 according to Example 2 includes a circular part (diameter φ1 is 100 μm) positioned at substantially the midst of the surface of a semiconductor light-emitting device viewed from the top surface (hereinafter referred to as "top surface"), a linear thin wire 110a extending from the midst of the circular part in the direction along one side of the top surface (a length L3 from the end of circular part is 70 μm), and thin wires 110b, 110c, and 110d disposed at even intervals by intersecting with the longitudinal direction of the thin wire 110a at 90 degrees. The thin wires 110b, 110c, and 110d are shaped so as to extend from one end, substantially midst, and the other end of the thin wire 110a in the directions along the other sides of the top surface.

A diameter φ3 of the interface electrode 120 according to Example 2 is 5 μm. The interface electrodes 120 are provided on an area excluding directly under the surface electrode 110 as in Example 1. However, different from Example 1, a plurality of interface electrodes 120 is disposed at the positions wherein distances from a plurality of thin wires (thin wires 110b, 110c, and 110d) in the surface electrode 110 becomes constant along the longitudinal direction thereof, respectively, when viewed from the top surface. Namely, a plurality of the interface electrodes 120 are provided at the positions wherein the distances from the sides of the thin wire 110b to interface electrodes 120 when viewed from the top surface, the distances from the sides of the thin wire 110c to interface electrodes 120 when viewed from the top surface, and the distances from the sides of the thin wire 110d to interface electrodes 120 when viewed from the top surface are constant, respectively. A pitch P2 between the respective interface electrodes 120 is substantially 20 μm. One semiconductor light-emitting device according to Example 2 is provided with several tens of the interface electrodes 120.

Also in Example 2, six types of semiconductor light-emitting devices are produced by changing a film thickness of the transparent layer 140 as in Example 1. Furthermore, as in Comparative Example to Example 1, a semiconductor light-emitting device according to Comparative Example to Example 2 wherein a film thickness of the transparent layer 140 is 110 nm, and the layout of the surface electrode 110 and the interface electrodes 120 is the same as Example 2 is also produced. The characteristic evaluation of the semiconductor light-emitting devices is conducted as in Example 1.

Table 2 indicates the results of the characteristic evaluation of the semiconductor light-emitting devices according to Example 2 and Comparative Example.

TABLE 2

| | SiO₂ film thickness (nm) | Not roughened Light output (mW) | Not roughened Drive voltage (V) | Roughened Light output (mW) | Roughened Drive voltage (V) | Output ratio after roughened (vs. 110 nm) |
|---|---|---|---|---|---|---|
| Comparative Example | 110 | 5.74 | 1.98 | 9.26 | 1.99 | 1.00 |
| Example 2 | 220 | 4.91 | 1.97 | 9.68 | 1.98 | 1.05 |
| | 330 | 5.47 | 1.98 | 10.30 | 1.97 | 1.11 |
| | 440 | 5.22 | 1.99 | 10.35 | 2.00 | 1.12 |
| | 550 | 5.38 | 1.98 | 10.50 | 1.99 | 1.13 |
| | 660 | 5.32 | 1.99 | 10.54 | 2.01 | 1.14 |
| | 770 | 5.42 | 1.97 | 10.54 | 2.00 | 1.14 |

(Evaluation at 20 mA)

Referring to Table 2, an output magnification of light output increases gradually with the increase of a film thickness of a SiO₂ film being the transparent layer 140 after applying a roughening treatment as in Example 1. In this case, the reason of more improvements in absolute vales of the light outputs in case of not roughening and roughening than Example 1 is due to the differences in the pattern and layout of the surface electrode 110 and the interface electrodes 120.

A factor for exerting remarkably an influence on the increase in light output is the total area and an individual size of the interface electrodes 120. Namely, a diameter of the interface electrodes 120 is 5 μm in the semiconductor light-emitting device according to Example 2 of the invention, so that area having a low reflectivity is reduced as compared with Example 1 wherein a diameter of the interface electrode is 15 μm. A diameter of the interface electrode 120 in Example 2 is specified within a range of from 3 μm to 5 μm in view of suppression of increase in drive voltage and improvements in light output of the semiconductor light-emitting device.

Furthermore, when a positional relationship between the surface electrode 110 and all the interface electrodes 120 is applied to a positional relationship wherein the distances from the sides of the thin wires of the surface electrodes 110 to the interface electrodes 120 when viewed from the top surface are made to be constant (equal), the light emission in a plane of the semiconductor light-emitting device can be uniformed. As a consequence, it can suppress to concentrate a current density to any of the interface electrodes 120, whereby reliability of the semiconductor light-emitting device can be improved, and a local heating of the semiconductor light-emitting device can be suppressed in case of applying a large current. Thus, electric current-light output characteristic is improved according to the semiconductor light-emitting device of Example 2.

As mentioned above, the same tendency as that of the calculation result in FIG. 3A in Example 1 is observed also in Example 2. Accordingly, it is considered to exemplify that the characteristic result of the semiconductor light-emitting device according to Example 2 is derived from improvements in the average reflectivity of a reflection region due to thickening a film thickness of the transparent layer 140 by the improvements in the light output of the semiconductor light-emitting device of Example 2.

Example 3

A semiconductor light-emitting device according to Example 3 has substantially the same composition as Example 2 except that a shape and layout of interface electrodes 120 differ from Example 2, so that the detailed explanation therefor is omitted excluding the differences thereof.

Figure 7:
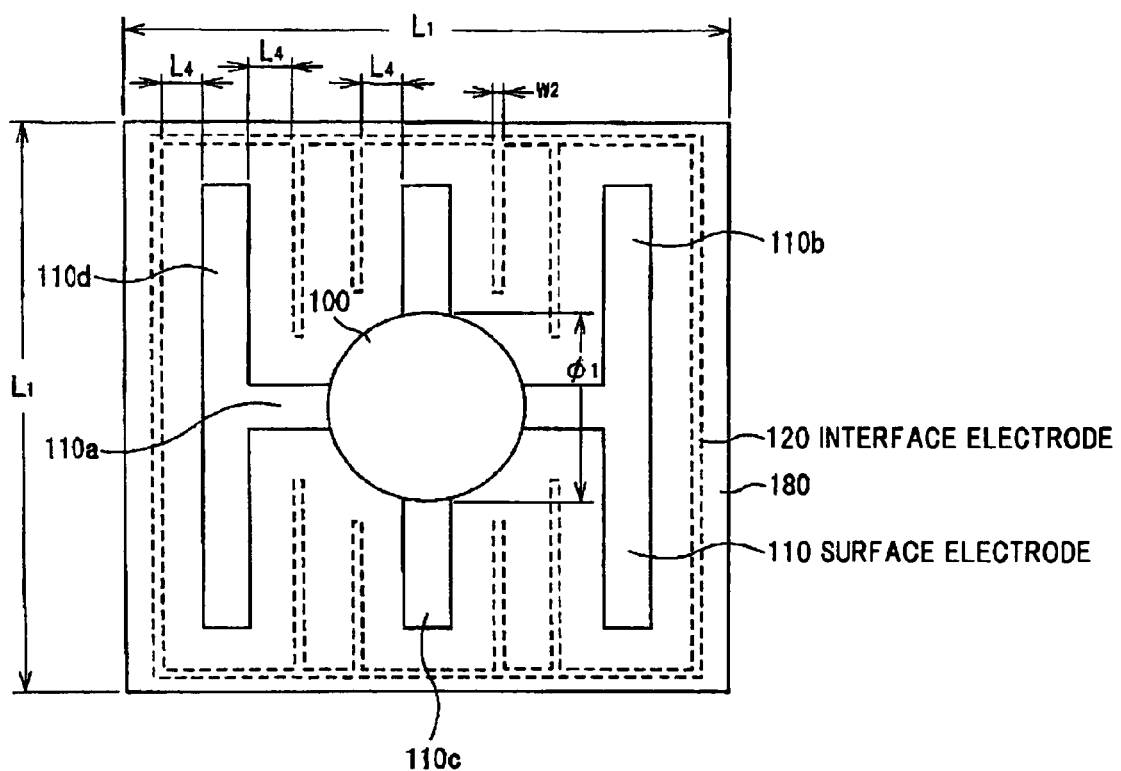
FIG. 7 is a top view showing a layout of a surface electrode and an interface electrode in Example 3 of the invention.

FIG. 7 is a top view showing a layout of a surface electrode and interface electrodes according to Example 3 of the invention.

An interface electrode according to Example 3 is formed to have a single shape. The interface electrode of Example 3 is formed to have a comb-shape so as to engage with a comb-shaped surface electrode 110 when viewed from the top surface. The interface electrode 120 of Example 3 is formed with a wire width of 5 μm. A positional relationship of the interface electrode 120 and thin wires 110b, 110c, and 110d of the surface electrode 110 is made to be the same as in Example 2 when viewed from the top surface.

Also in Example 3, six types of semiconductor light-emitting devices are produced by changing a film thickness of a transparent layer 140 as in Example 1. Furthermore, as in Comparative Example to Example 1, a semiconductor light-emitting device according to Comparative Example to Example 3 wherein a film thickness of the transparent layer 140 is 110 nm, and the layout of the surface electrode 110 and the interface electrode 120 is the same as Example 3 is also produced. The characteristic evaluation of the semiconductor light-emitting devices is conducted as in Example 1.

Table 3 indicates the results of the characteristic evaluation of the semiconductor light-emitting devices according to Example 3 and Comparative Example.

TABLE 3

| | $SiO_2$ film thickness (nm) | Not roughened | | Roughened | | Output ratio after roughened (vs. 110 nm) |
|---|---|---|---|---|---|---|
| | | Light output (mW) | Drive voltage (V) | Light output (mW) | Drive voltage (V) | |
| Comparative Example | 110 | 5.31 | 1.96 | 8.56 | 1.97 | 1.00 |
| Example 3 | 220 | 4.55 | 1.95 | 8.91 | 1.97 | 1.04 |
| | 330 | 5.07 | 1.96 | 9.41 | 1.98 | 1.10 |
| | 440 | 4.96 | 1.96 | 9.72 | 1.97 | 1.14 |
| | 550 | 5.12 | 1.95 | 9.63 | 1.97 | 1.13 |
| | 660 | 4.97 | 1.97 | 9.62 | 2.00 | 1.12 |
| | 770 | 5.04 | 1.97 | 9.77 | 1.99 | 1.14 |

(Evaluation at 20 mA)

Referring to Table 3, there is such a tendency that an output magnification of light output increases gradually with the increase of a film thickness of a $SiO_2$ film being the transparent layer 140 after applying a roughening treatment as in Examples 1 and 2. In this case, the reason of more improvements in absolute vales of the light outputs in case of not roughening and roughening than Example 1 is due to the differences in the pattern and layout of the surface electrode 110 and the interface electrodes 120.

In comparison with the semiconductor light-emitting device of Example 2, although light output of the semiconductor light-emitting device of Example 3 somewhat decreases, it does not remarkably decrease with taking the increase of an area of the interface electrode 120 into consideration. This is because the wire width of the interface electrode 120 is 5 μm, and the area of a contact region of the interface electrode 120 having a low reflectivity and a semiconductor multilayer structure 130 is comparatively small. A wire width of the interface electrode 120 in Example 3 is specified within a range of from 3 μm to 5 μm in view of suppression of increase in drive voltage, and an improvement in light output of the semiconductor light-emitting device.

As mentioned above, the same tendency as that of the calculation result in FIG. 3A in Examples 1 and 2 is observed also in Example 3. Accordingly, it is considered to exemplify that the characteristic result of the semiconductor light-emitting device according to Example 3 is derived from improvements in the average reflectivity of a reflection region due to thickening a film thickness of the transparent layer 140 by the improvements in the light output of the semiconductor light-emitting device of Example 3.

Example 4

A semiconductor light-emitting device according to Example 4 has substantially the same composition as Example 3 except that the material for a reflection layer 140 is Ag, so that the detailed explanation therefor is omitted excluding the differences thereof.

Also in Example 4, six types of semiconductor light-emitting devices are produced by changing a film thickness of a transparent layer 140 as in Example 1. Furthermore, as in Comparative Example to Example 1, a semiconductor light-emitting device according to Comparative Example to Example 4 wherein a film thickness of the transparent layer 140 is 110 nm, the layout of the surface electrode 110 and the interface electrode 120 is the same as Example 4, and a material for the reflection layer 140 is the same as Example 4 is also produced. The characteristic evaluation of the semiconductor light-emitting devices is conducted as in Example 1.

Table 4 indicates the results of the characteristic evaluation of the semiconductor light-emitting devices in Example 4 and Comparative Example.

TABLE 4

| | $SiO_2$ film thickness (nm) | Not roughened | | Roughened | | Output ratio after roughened (vs. 110 nm) |
|---|---|---|---|---|---|---|
| | | Light output (mW) | Drive voltage (V) | Light output (mW) | Drive voltage (V) | |
| Comparative Example | 110 | 5.86 | 1.97 | 9.83 | 1.96 | 1.00 |
| Example 4 | 220 | 5.69 | 1.97 | 9.7 | 1.98 | 0.99 |
| | 330 | 5.72 | 1.98 | 10.00 | 1.99 | 1.02 |
| | 440 | 5.70 | 1.95 | 10.04 | 1.96 | 1.02 |
| | 550 | 5.78 | 1.96 | 10.01 | 1.98 | 1.02 |
| | 660 | 5.72 | 1.97 | 10.07 | 1.99 | 1.02 |
| | 770 | 5.77 | 1.96 | 10.02 | 1.99 | 1.02 |

(Evaluation at 20 mA)

Referring to Table 4, a light output increases gradually with the increase of a film thickness of the transparent layer 140 in a range of from 220 nm to 440 nm in the case that a film thickness of a $SiO_2$ film being the transparent layer 140 is 220 nm or more after applying a roughening treatment. The light output is improved as compared with that of Comparative Example (film thickness: 110 nm) in the case that a film thickness of the transparent layer 140 is 330 nm or more. Also in the semiconductor light-emitting device of Example 4, an output magnification of the light output after a roughening treatment increases with the increase in a film thickness of the transparent layer 140 in the case that a film thickness of the transparent layer 140 is 220 nm or more, and a saturation tendency is observed in the case that a film thickness of the transparent layer 140 is 330 nm or more. Furthermore, when the light output of the semiconductor light-emitting device after a roughening treatment is checked, the increase of light output exhibits a saturation tendency in the case that a film thickness of the transparent layer ranges from 330 nm to 770 nm. The reason why the light-emitting device according to Example 4 has totally a higher light output than Example 3 is in that the reflection layer 140 made of Ag of Example 4 exhibits a higher reflectivity than that of the reflection layer 150 made of Au of Example 3.

An average reflectivity of the reflection layer 150 made of Ag used in Example 4 becomes the highest in the case that the surface of the semiconductor multilayer structure 130 is smooth and d=λ/(4 n) is valid as shown in FIG. 3A. On one hand, it is found that an average reflectivity is higher than the case of d=λ/(4 n), when the surface of the semiconductor multilayer structure 130 has a diffused reflection surface in the case that a thickness d=3λ/(4 n) or thicker. Since an average reflectivity exhibits a saturation tendency in the case that a thickness d=3λ/(4 n) or thicker, it is understood that a thickness of the transparent layer 140 is preferably d=3λ/(4 n) or thicker.

Referring to Table 4, it is found that there is the same tendency as that of the calculation result shown in FIG. 3A. Accordingly, it is understood in Example 4 to exemplify such fact that an average reflectivity of a reflection region increases by increasing a film thickness of the transparent layer 140, whereby a light output of the semiconductor light-emitting device according to Example 4 is improved.

Example 5

A semiconductor light-emitting device according to Example 5 has substantially the same composition as Examples 3 and 4 except that the material for a reflection layer 140 is Cu, so that the detailed explanation therefor is omitted excluding the differences thereof.

Also in Example 5, six types of semiconductor light-emitting devices are produced by changing a film thickness of a transparent layer 140 as in Example 1. Furthermore, as in Comparative Example to Example 1, a semiconductor light-emitting device according to Comparative Example to Example 5 wherein a film thickness of the transparent layer 140 is 110 nm, the layout of the surface electrode 110 and the interface electrode 120 is the same as Example 5, and a material for the reflection layer 140 is the same as Example 5 is also produced. The characteristic evaluation of the semiconductor light-emitting devices is conducted as in Example 1.

Table 5 indicates the results of the characteristic evaluation of the semiconductor light-emitting devices according to Example 5 and Comparative Example.

TABLE 5

| | SiO$_2$ film thickness (nm) | Not roughened | | Roughened | | Output ratio after roughened (vs. 110 nm) |
| | | Light output (mW) | Drive voltage (V) | Light output (mW) | Drive voltage (V) | |
|---|---|---|---|---|---|---|
| Comparative Example | 110 | 5.26 | 1.96 | 8.96 | 1.97 | 1.00 |
| Example 5 | 220 | 4.51 | 1.96 | 8.94 | 1.98 | 1.00 |
| | 330 | 5.11 | 1.98 | 9.48 | 2.00 | 1.06 |
| | 440 | 4.92 | 1.98 | 9.70 | 1.99 | 1.08 |
| | 550 | 5.08 | 1.97 | 9.81 | 1.99 | 1.09 |
| | 660 | 4.84 | 1.99 | 9.61 | 2.01 | 1.07 |
| | 770 | 5.10 | 1.99 | 9.65 | 2.01 | 1.08 |

(Evaluation at 20 mA)

Referring to Table 5, there is such tendency that the output magnification of a light output increases gradually with the increase of a film thickness of the transparent layer 140 in the case that a film thickness of a SiO$_2$ film being the transparent layer 140 is 220 nm or more after applying a roughening treatment. The light output is improved as compared with that of Comparative Example (film thickness: 110 nm) in the case that a film thickness of the transparent layer 140 is 330 nm or more.

An average reflectivity of the reflection layer 150 made of Cu used in Example 5 becomes the highest in the case that the surface of the semiconductor multilayer structure 130 is smooth and d=λ/(4 n) is valid as shown in FIG. 3A. On one hand, it is found that an average reflectivity is higher than the case of d=λ/(4 n), when the surface of the semiconductor multilayer structure 130 has a diffused reflection surface in the case that a thickness d=3λ/(4 n) or thicker. Since an average reflectivity exhibits a saturation tendency in the case that a thickness d=3λ/(4 n) or thicker, it is understood that a thickness of the transparent layer 140 is preferably d=3λ/(4 n) or thicker.

Referring to Table 5, it is found that there is the same tendency as that of the calculation result shown in FIG. 3A. Accordingly, it is understood in Example 5 to exemplify such fact that the average reflectivity of a reflection region increases by increasing a film thickness of the transparent layer 140, and consequently a light output of the semiconductor light-emitting device according to Example 5 is improved.

Example 6

A semiconductor light-emitting device according to Example 6 has substantially the same composition as Example 3 except that the material for a reflection layer 140 is Al, so that the detailed explanation therefor is omitted excluding the differences thereof.

Also in Example 6, six types of semiconductor light-emitting devices are produced by changing a film thickness of a transparent layer 140 as in Example 1. Furthermore, as in Comparative Example to Example 1, a semiconductor light-emitting device according to Comparative Example to Example 6 wherein a film thickness of the transparent layer 140 is 110 nm, the layout of the surface electrode 110 and the interface electrode 120 is the same as Example 6, and a material for the reflection layer 140 is the same as Example 6 is also produced. The characteristic evaluation of the semiconductor light-emitting devices is conducted as in Example 1.

Table 6 indicates the results of the characteristic evaluation of the semiconductor light-emitting devices according to Example 6 and Comparative Example.

TABLE 6

| | SiO$_2$ film thickness (nm) | Not roughened | | Roughened | | Output ratio after roughened (vs. 110 nm) |
| | | Light output (mW) | Drive voltage (V) | Light output (mW) | Drive voltage (V) | |
|---|---|---|---|---|---|---|
| Comparative Example | 110 | 4.90 | 1.95 | 9.17 | 1.97 | 1.00 |
| Example 6 | 220 | 4.02 | 1.97 | 9.07 | 1.98 | 0.99 |
| | 330 | 4.45 | 1.95 | 9.42 | 1.97 | 1.03 |
| | 440 | 4.27 | 1.97 | 9.28 | 1.99 | 1.01 |
| | 550 | 4.54 | 1.97 | 9.35 | 1.99 | 1.02 |
| | 660 | 4.43 | 1.98 | 9.46 | 1.99 | 1.03 |
| | 770 | 4.56 | 1.96 | 9.48 | 1.98 | 1.03 |

(Evaluation at 20 mA)

Referring to Table 6, there is such a tendency that the output magnification of a light output increases gradually with the increase of a film thickness of the transparent layer 140 in the case that a film thickness of a $SiO_2$ film being the transparent layer 140 is 220 nm or more after applying a roughening treatment. The light output is improved as compared with that of Comparative Example (film thickness: 110 nm) in the case that a film thickness of the transparent layer 140 is 330 nm or more.

An average reflectivity of the reflection layer 150 made of Al used in Example 6 becomes the highest in the case that the surface of the semiconductor multilayer structure 130 is smooth and $d=\lambda/(4n)$ is valid as shown in FIG. 3A. On one hand, it is found that an average reflectivity is higher than the case of $d=\lambda/(4n)$, when the surface of the semiconductor multilayer structure 130 has a diffused reflection surface in the case that a thickness $d=3\lambda/(4n)$ or thicker. Since an average reflectivity exhibits a saturation tendency in the case that a thickness $d=3\lambda/(4n)$ or thicker, it is understood that a thickness of the transparent layer 140 is preferably $d=3\lambda/(4n)$ or thicker.

Referring to Table 6, it is found that there is the same tendency as that of the calculation result shown in FIG. 3A. Accordingly, it is understood in Example 6 to exemplify such fact that the average reflectivity of a reflection region increases by increasing a film thickness of the transparent layer 140, and consequently a light output of the semiconductor light-emitting device according to Example 6 is improved.

Example 7

A semiconductor light-emitting device according to Example 7 has substantially the same composition as Examples 3 except that an etchant in case of forming a diffused reflection generating part 180 differs from Example 3, so that the detailed explanation therefor is omitted excluding the differences thereof.

In Example 7, hydrochloric acid diluted by pure water is not used as the etchant in case of roughening the surface of an n-type cladding layer 133 (n-type $(Al_{0.7}Ga_{0.3})_{0.5}In_{0.5}P$ cladding layer) as described in FIG. 4J, but a mixed etchant of hydrobromic acid, hydrogen peroxide solution, and pure water is used as an isotropic etchant. Specifically, the mixed etchant is prepared by admixing hydrobromic acid, hydrogen peroxide solution, and pure water in a ratio of hydrobromic acid:hydrogen peroxide solution:pure water=20:1:100. Roughening is conducted to adjust an etching time to be two minutes. A depth etched in the surface of the n-type cladding layer 133 by roughening is about 1 µm.

As a result of the roughening conducted in Example 7, a plurality of configurations being three-dimensional structures of a concave substantially hemisphere are formed as a diffused reflection generating part 180 on the surface of the n-type cladding layer 133. In the concave substantially hemispherical configurations being the diffused reflection generating part 180, a light propagating in a semiconductor multilayer structure 130 including the n-type cladding layer 133 and reaching to the diffused reflection generating part 180 is diffusely reflected. According to a predetermined roughening treatment, a plurality of configurations being three-dimensional structures of a convex substantially hemispherical may also be formed as the diffused reflection generating part 180 on the surface of the n-type cladding layer 133. A light propagating in the semiconductor multilayer structure 130 and reaching to the concave configurations is also diffusely reflected thereby.

Concave or convex substantially hemispherical structures to be formed on the surface of the n-type cladding layer 133 according to the roughening treatment of Example 7 are aligned with a plurality of them. Specifically, concave- or convex-formed substantially hemispherical structures are formed in a layout having a regular cycle on the surface of n-type cladding layer 33 in response to the layout of opening parts of a resist pattern formed on the surface of the n-type cladding layer 133.

Also in Example 7, six types of semiconductor light-emitting devices are produced by changing a film thickness of a transparent layer 140 as in Example 1. Furthermore, as in Comparative Example to Example 1, a semiconductor light-emitting device according to Comparative Example to Example 7 wherein a film thickness of the transparent layer 140 is 110 nm, and the same roughening treatment as Example 7 is applied is also produced. The characteristic evaluation of the semiconductor light-emitting devices is conducted as in Example 1.

Table 7 indicates the results of the characteristic evaluation of the semiconductor light-emitting devices according to Example 7 and Comparative Example.

TABLE 7

| | $SiO_2$ film thickness (nm) | Not roughened Light output (mW) | Not roughened Drive voltage (V) | Roughened Light output (mW) | Roughened Drive voltage (V) | Output ratio after roughened (vs. 110 nm) |
|---|---|---|---|---|---|---|
| Comparative Example | 110 | 5.22 | 1.97 | 8.51 | 1.96 | 1.00 |
| Example 7 | 220 | 4.53 | 1.98 | 8.99 | 2.00 | 1.06 |
| | 330 | 5.06 | 2.00 | 9.56 | 2.01 | 1.12 |
| | 440 | 4.79 | 1.96 | 9.53 | 1.98 | 1.12 |
| | 550 | 5.00 | 2.00 | 9.94 | 1.96 | 1.17 |
| | 660 | 4.92 | 1.97 | 9.68 | 1.98 | 1.14 |
| | 770 | 4.98 | 1.98 | 9.77 | 1.96 | 1.15 |

(Evaluation at 20 mA)

Referring to Table 7, there is such a tendency that the output magnification of a light output increases gradually with the increase of a film thickness of the transparent layer 140 after applying a roughening treatment. The light output is improved as compared with that of Comparative Example (film thickness: 110 nm) in the case that a film thickness of the transparent layer 140 is 220 nm or more.

Referring to Table 7, it is found that there is the same tendency as that of the calculation result shown in FIG. 3A. Accordingly, it is understood in Example 7 to exemplify such fact that the average reflectivity of a reflection region increases by increasing a film thickness of the transparent layer 140, and consequently a light output of the semiconductor light-emitting device according to Example 7 is improved.

Example 8

A semiconductor light-emitting device according to Example 8 has substantially the same composition as Example 3 except that a manner of etching in case of forming a diffused reflection generating part 180 differs from Example 3, so that the detailed explanation therefor is omitted excluding the differences thereof.

In Example 8, a n-type $(Al_{0.7}Ga_{0.3})_{0.5}In_{0.5}P$ cladding layer being a n-cladding layer 133 is exposed, and then, a bonded wafer 7c is dipped into a mixed acid etchant of hydrochloric acid and acetic acid. Namely, as described in the method of making the semiconductor light-emitting device 1 of the first embodiment, the bonded wafer 7c shown in FIG. 4I is formed, and then, a roughening treatment is conducted on the surface of the n-type $(Al_{0.7}Ga_{0.3})_{0.5}In_{0.5}P$ cladding layer with the mixed acid etchant without forming a dot pattern prepared from a photoresist on the n-type cladding layer 133. After the roughening treatment, a pad electrode 100 and a back electrode 220 are formed as in the method for making the semiconductor light-emitting device 1 of the first embodiment.

In a mixed ratio of hydrochloric acid and acetic acid, the ratio is about 1 of hydrochloric acid with respect about 2 of acetic acid. A dipping time of the bonded wafer 7c into the mixed acid enchant is 60 seconds. The surface of the n-type cladding layer 133 after the roughening treatment is observed. As a result, an irregular unsmooth surface which has an arithmetic average roughness of 310 nm is formed. A light propagated from the semiconductor multilayer structure to the unsmooth surface by means of the formed unsmooth surface is diffusely reflected. Namely, the formed unsmooth surface has a function as a diffused reflection surface which reflects diffusely a light. In the roughening treatment of Example 8, it is preferred that an arithmetic average roughening is made to be larger than ¼ of a value obtained by dividing a wavelength of light emitted from the light-emitting layer 135 by a refractive index of the n-type cladding layer 133 such that irregularity in the shape of the surface of the n-type cladding layer 133 has an optical meaning.

Also in Example 8, six types of semiconductor light-emitting devices are produced by changing a film thickness of a transparent layer 140 as in Example 1. Furthermore, as in Comparative Example to Example 1, a semiconductor light-emitting device according to Comparative Example to Example 8 wherein a film thickness of the transparent layer 140 is 110 nm, and the same roughening treatment as Example 8 is applied is also produced. The characteristic evaluation of the semiconductor light-emitting devices is conducted as in Example 1.

Table 8 indicates the results of the characteristic evaluation of the semiconductor light-emitting devices according to Example 8 and Comparative Example.

TABLE 8

| | $SiO_2$ film thickness (nm) | Not roughened Light output (mW) | Not roughened Drive voltage (V) | Roughened Light output (mW) | Roughened Drive voltage (V) | Output ratio after roughened (vs. 110 nm) |
|---|---|---|---|---|---|---|
| Comparative Example | 110 | 5.28 | 1.98 | 6.93 | 2.00 | 1.00 |
| Example 8 | 220 | 4.66 | 1.97 | 7.13 | 1.99 | 1.03 |
| | 330 | 5.11 | 1.98 | 7.80 | 2.00 | 1.13 |
| | 440 | 4.96 | 1.98 | 7.70 | 1.99 | 1.11 |
| | 550 | 4.98 | 1.97 | 7.96 | 1.99 | 1.15 |
| | 660 | 4.95 | 1.99 | 7.89 | 2.01 | 1.14 |
| | 770 | 5.02 | 1.98 | 7.78 | 1.99 | 1.12 |

(Evaluation at 20 mA)

Referring to Table 8, there is such a tendency that the output magnification of a light output increases gradually with the increase of a film thickness of the transparent layer 140 after applying a roughening treatment. The light output is improved as compared with that of Comparative Example (film thickness: 110 nm) in the case that a film thickness of the transparent layer 140 is 220 nm or more. Although the light output after the roughening treatment decreases as compared with that of the semiconductor device light-emitting device according to Example 3, this is because a diffused reflection in the unsmooth surface formed by the roughening treatment applied in Example 8 is small in a diffusion effect of angle.

Referring to Table 8, it is found that there is the same tendency as that of the calculation result shown in FIG. 3A. Accordingly, it is understood in Example 8 to exemplify such fact that the average reflectivity of a reflection region increases by increasing a film thickness of the transparent layer 140, and consequently a light output of the semiconductor light-emitting device according to Example 8 is improved.

Example 9

A semiconductor light-emitting device according to Example 9 has substantially the same composition as Example 3 except that a material for a transparent layer 140 being a part of the reflection region differs from Example 3, so that the detailed explanation therefor is omitted excluding the differences thereof.

In Example 9, a material of a reflection layer 150 being a part of a reflection region is changed to Au, Ag, Cu, and Al; and semiconductor light-emitting devices are produced from these materials, respectively. Furthermore, the transparent layer 140 of the semiconductor light-emitting device according to Example 9 is formed of silicon nitride (SiN). In Example 9, total six types of a semiconductor light-emitting device provided with the transparent layer (SiN film) 140 having a different film thickness from one another are produced. Namely, six types of semiconductor light-emitting devices having six types of film thicknesses of the transparent layer 140 of 160 nm, 240 nm, 320 nm, 400 nm, 480 nm, and 560 nm are produced. As Comparative Example to Example 9, a semiconductor light-emitting device wherein a thickness of the transparent layer 140 is selected to be 80 nm is also produced.

Film thicknesses of the transparent layer 140 according to Example 9 are specified to the values of multiple numbers of a reference $d=\lambda/(4\times n)$ where d is a film thickness of SiN, $\lambda$ is a light emission peak wavelength of a semiconductor light-emitting device (630 nm in Example 9), and n is a refractive index of the transparent layer 140 (i.e., a refractive index of SiN) (2.0 in case of SiN) with respect to a light emission wavelength of the semiconductor light-emitting device, i.e. they are $d=2\lambda/(4\times n)$, $d=3\lambda/(4\times n)$, $d=4\lambda/(4\times n)$, $d=5\lambda/(4\times n)$, $d=6\lambda/(4\times n)$, and $d=7\lambda/(4\times n)$. A SiN film being the transparent layer 140 is formed by a RF sputtering method.

Table 9 indicates the results of the characteristic evaluation of the semiconductor light-emitting devices according to Example 9 and Comparative Example.

TABLE 9

| Material for reflection layer | SiN film thickness (nm) | Not roughened Light output (mW) | Not roughened Drive voltage (V) | Roughened Light output (mW) | Roughened Drive voltage (V) | Output ratio after roughened (vs. 80 nm) |
|---|---|---|---|---|---|---|
| Au C. Ex. | 80 | 5.08 | 1.98 | 5.25 | 2.00 | 1.00 |
| Ex. 9 | 160 | 4.18 | 1.98 | 6.35 | 1.98 | 1.21 |
| | 240 | 4.99 | 1.99 | 7.39 | 2.01 | 1.41 |
| | 320 | 4.51 | 1.99 | 7.31 | 1.95 | 1.39 |
| | 400 | 4.81 | 1.97 | 7.41 | 1.97 | 1.41 |
| | 480 | 4.67 | 1.98 | 7.31 | 2.01 | 1.39 |
| | 560 | 4.83 | 2.00 | 7.37 | 1.99 | 1.40 |

TABLE 9-continued

| Material for reflection layer | | SiN film thickness (nm) | Not roughened | | Roughened | | Output ratio after roughened (vs. 80 nm) |
|---|---|---|---|---|---|---|---|
| | | | Light output (mW) | Drive voltage (V) | Light output (mW) | Drive voltage (V) | |
| Ag | C. Ex. | 80 | 5.85 | 1.97 | 6.90 | 1.99 | 1.00 |
| | Ex. 9 | 160 | 5.50 | 1.98 | 7.04 | 1.97 | 1.02 |
| | | 240 | 5.75 | 1.98 | 7.55 | 1.98 | 1.09 |
| | | 320 | 5.64 | 1.96 | 7.89 | 1.97 | 1.14 |
| | | 400 | 5.55 | 1.97 | 7.99 | 1.99 | 1.16 |
| | | 480 | 5.63 | 1.98 | 8.14 | 1.96 | 1.18 |
| | | 560 | 5.53 | 1.98 | 8.05 | 2.01 | 1.17 |
| Cu | C. Ex. | 80 | 5.09 | 1.99 | 5.38 | 1.98 | 1.00 |
| | Ex. 9 | 160 | 4.23 | 1.99 | 5.90 | 1.98 | 1.10 |
| | | 240 | 5.04 | 1.96 | 7.36 | 1.97 | 1.37 |
| | | 320 | 4.43 | 2.00 | 7.22 | 1.97 | 1.34 |
| | | 400 | 4.67 | 1.98 | 7.32 | 1.96 | 1.36 |
| | | 480 | 4.62 | 2.00 | 7.38 | 1.99 | 1.37 |
| | | 560 | 4.69 | 2.00 | 7.50 | 1.99 | 1.39 |
| Al | C. Ex. | 80 | 4.77 | 1.99 | 5.47 | 2.00 | 1.00 |
| | Ex. 9 | 160 | 3.48 | 1.98 | 5.58 | 1.96 | 1.02 |
| | | 240 | 4.46 | 1.99 | 6.30 | 1.96 | 1.15 |
| | | 320 | 3.97 | 1.99 | 6.41 | 1.96 | 1.17 |
| | | 400 | 4.12 | 1.98 | 6.64 | 1.98 | 1.21 |
| | | 480 | 4.12 | 1.99 | 6.73 | 1.97 | 1.23 |
| | | 560 | 4.12 | 2.01 | 6.91 | 1.98 | 1.26 |

(Evaluation at 20 mA)
C. Ex.: Comparative Example,
Ex.: Example

Referring to Table 9, there is such a tendency that the output magnification of a light output increases gradually after applying a roughening treatment irrespective of a material for the reflection layer 150. Namely, referring to Table 9, it is found that there is the same tendency as that of the calculation result shown in FIG. 3A. Accordingly, it is understood in Example 9 to exemplify such fact that the average reflectivity of a reflection region increases by increasing a film thickness of the transparent layer 140, and consequently a light output of the semiconductor light-emitting device according to Example 9 is improved.

Tables 10 and 11 indicate average reflectivity in reflection regions of a structure having a diffused reflection surface ($\theta c$: 90°) in the case that a refractive index of a material composing a transparent layer 140 is changed.

TABLE 10

| Material for reflection layer | Refractive index | Reflectivity | | | | Reflectivity (normalized by $\lambda/4n$ value) | | |
|---|---|---|---|---|---|---|---|---|
| | | $\lambda/4n$ | $3\lambda/4n$ | $5\lambda/4n$ | $7\lambda/n$ | $3\lambda/4n$ | $5\lambda/4n$ | $7\lambda/4n$ |
| Au | 1.2 | 0.9864 | 0.9917 | 0.9950 | 0.9953 | 1.0054 | 1.0087 | 1.0090 |
| | 1.3 | 0.9807 | 0.9902 | 0.9938 | 0.9940 | 1.0097 | 1.0134 | 1.0136 |
| | 1.4 | 0.9731 | 0.9887 | 0.9925 | 0.9926 | 1.0161 | 1.0200 | 1.0200 |
| | 1.5 | 0.9630 | 0.9874 | 0.9910 | 0.9910 | 1.0253 | 1.0291 | 1.0290 |
| | 1.6 | 0.9498 | 0.9861 | 0.9894 | 0.9893 | 1.0382 | 1.0417 | 1.0415 |
| | 1.7 | 0.9327 | 0.9848 | 0.9876 | 0.9874 | 1.0559 | 1.0589 | 1.0587 |
| | 1.8 | 0.9106 | 0.9834 | 0.9856 | 0.9853 | 1.0800 | 1.0823 | 1.0821 |
| | 1.9 | 0.8831 | 0.9818 | 0.9834 | 0.9831 | 1.1119 | 1.1137 | 1.1133 |
| | 2 | 0.8515 | 0.9801 | 0.9811 | 0.9808 | 1.1510 | 1.1522 | 1.1518 |
| | 2.1 | 0.8337 | 0.9780 | 0.9786 | 0.9783 | 1.1732 | 1.1738 | 1.1734 |
| | 2.2 | 0.8896 | 0.9758 | 0.9759 | 0.9756 | 1.0969 | 1.0970 | 1.0966 |
| | 2.3 | 0.9235 | 0.9733 | 0.9730 | 0.9727 | 1.0539 | 1.0536 | 1.0533 |
| | 2.4 | 0.9344 | 0.9704 | 0.9699 | 0.9696 | 1.0385 | 1.0381 | 1.0377 |
| | 2.5 | 0.9384 | 0.9671 | 0.9666 | 0.9663 | 1.0306 | 1.0301 | 1.0298 |
| | 2.6 | 0.9396 | 0.9635 | 0.9631 | 0.9628 | 1.0254 | 1.0250 | 1.0247 |
| | 2.7 | 0.9393 | 0.9595 | 0.9592 | 0.9590 | 1.0215 | 1.0212 | 1.0209 |
| | 2.8 | 0.9382 | 0.9551 | 0.9550 | 0.9548 | 1.0180 | 1.0179 | 1.0177 |
| | 2.9 | 0.9366 | 0.9502 | 0.9504 | 0.9502 | 1.0145 | 1.0147 | 1.0146 |
| | 3 | 0.9346 | 0.9446 | 0.9451 | 0.9451 | 1.0107 | 1.0113 | 1.0112 |
| Ag | 1.2 | 0.9977 | 0.9977 | 0.9985 | 0.9991 | 1.0000 | 1.0008 | 1.0014 |
| | 1.3 | 0.9965 | 0.9967 | 0.9981 | 0.9988 | 1.0002 | 1.0016 | 1.0023 |
| | 1.4 | 0.9950 | 0.9955 | 0.9977 | 0.9984 | 1.0006 | 1.0027 | 1.0034 |
| | 1.5 | 0.9929 | 0.9942 | 0.9972 | 0.9979 | 1.0013 | 1.0043 | 1.0050 |
| | 1.6 | 0.9903 | 0.9928 | 0.9968 | 0.9974 | 1.0025 | 1.0066 | 1.0072 |
| | 1.7 | 0.9867 | 0.9913 | 0.9963 | 0.9968 | 1.0046 | 1.0097 | 1.0102 |
| | 1.8 | 0.9820 | 0.9898 | 0.9958 | 0.9962 | 1.0080 | 1.0140 | 1.0144 |
| | 1.9 | 0.9756 | 0.9884 | 0.9951 | 0.9954 | 1.0131 | 1.0200 | 1.0203 |
| | 2 | 0.9668 | 0.9872 | 0.9945 | 0.9946 | 1.0211 | 1.0286 | 1.0288 |
| | 2.1 | 0.9542 | 0.9862 | 0.9937 | 0.9938 | 1.0336 | 1.0414 | 1.0415 |
| | 2.2 | 0.9351 | 0.9854 | 0.9928 | 0.9929 | 1.0538 | 1.0617 | 1.0618 |
| | 2.3 | 0.9027 | 0.9847 | 0.9918 | 0.9918 | 1.0909 | 1.0987 | 1.0988 |
| | 2.4 | 0.8512 | 0.9842 | 0.9908 | 0.9907 | 1.1563 | 1.1640 | 1.1640 |
| | 2.5 | 0.9571 | 0.9858 | 0.9896 | 0.9895 | 1.0300 | 1.0340 | 1.0339 |
| | 2.6 | 0.9705 | 0.9874 | 0.9883 | 0.9882 | 1.0175 | 1.0184 | 1.0183 |
| | 2.7 | 0.9745 | 0.9863 | 0.9869 | 0.9868 | 1.0121 | 1.0127 | 1.0126 |
| | 2.8 | 0.9761 | 0.9848 | 0.9853 | 0.9852 | 1.0090 | 1.0095 | 1.0094 |
| | 2.9 | 0.9765 | 0.9831 | 0.9835 | 0.9835 | 1.0067 | 1.0072 | 1.0071 |
| | 3 | 0.9764 | 0.9810 | 0.9815 | 0.9815 | 1.0046 | 1.0051 | 1.0051 |

TABLE 11

| Material for reflection layer | Refractive index | Reflectivity | | | | Reflectivity (normalized by λ/4n value) | | |
|---|---|---|---|---|---|---|---|---|
| | | λ/4n | 3λ/4n | 5λ/4n | 7λ/n | 3λ/4n | 5λ/4n | 7λ/4n |
| Cu | 1.2 | 0.9897 | 0.9914 | 0.9948 | 0.9952 | 1.0035 | 1.0069 | 1.0073 |
| | 1.3 | 0.9830 | 0.9895 | 0.9936 | 0.9939 | 1.0066 | 1.0108 | 1.0111 |
| | 1.4 | 0.9765 | 0.9877 | 0.9922 | 0.9925 | 1.0114 | 1.0161 | 1.0163 |
| | 1.5 | 0.9680 | 0.9859 | 0.9907 | 0.9908 | 1.0185 | 1.0235 | 1.0236 |
| | 1.6 | 0.9569 | 0.9842 | 0.9890 | 0.9890 | 1.0285 | 1.0335 | 1.0336 |
| | 1.7 | 0.9425 | 0.9826 | 0.9871 | 0.9871 | 1.0425 | 1.0474 | 1.0473 |
| | 1.8 | 0.9238 | 0.9810 | 0.9851 | 0.9849 | 1.0619 | 1.0663 | 1.0662 |
| | 1.9 | 0.8997 | 0.9792 | 0.9828 | 0.9826 | 1.0884 | 1.0924 | 1.0921 |
| | 2 | 0.8692 | 0.9774 | 0.9803 | 0.9801 | 1.1245 | 1.1279 | 1.1276 |
| | 2.1 | 0.8331 | 0.9753 | 0.9776 | 0.9774 | 1.1707 | 1.1735 | 1.1731 |
| | 2.2 | 0.8118 | 0.9730 | 0.9747 | 0.9744 | 1.1986 | 1.2008 | 1.2004 |
| | 2.3 | 0.8751 | 0.9705 | 0.9716 | 0.9713 | 1.1091 | 1.1103 | 1.1100 |
| | 2.4 | 0.9124 | 0.9678 | 0.9683 | 0.9679 | 1.0607 | 1.0612 | 1.0608 |
| | 2.5 | 0.9249 | 0.9645 | 0.9646 | 0.9643 | 1.0428 | 1.0430 | 1.0427 |
| | 2.6 | 0.9296 | 0.9606 | 0.9607 | 0.9604 | 1.0334 | 1.0335 | 1.0331 |
| | 2.7 | 0.9311 | 0.9563 | 0.9565 | 0.9562 | 1.0271 | 1.0272 | 1.0269 |
| | 2.8 | 0.9310 | 0.9515 | 0.9518 | 0.9516 | 1.0220 | 1.0223 | 1.0221 |
| | 2.9 | 0.9298 | 0.9461 | 0.9466 | 0.9464 | 1.0174 | 1.0180 | 1.0179 |
| | 3 | 0.9280 | 0.9398 | 0.9406 | 0.9406 | 1.0127 | 1.0136 | 1.0135 |
| Al | 1.2 | 0.9906 | 0.9904 | 0.9915 | 0.9923 | 0.9998 | 1.0008 | 1.0017 |
| | 1.3 | 0.9874 | 0.9875 | 0.9891 | 0.9902 | 1.0002 | 1.0017 | 1.0028 |
| | 1.4 | 0.9834 | 0.9841 | 0.9864 | 0.9878 | 1.0008 | 1.0031 | 1.0045 |
| | 1.5 | 0.9785 | 0.9802 | 0.9834 | 0.9851 | 1.0017 | 1.0050 | 1.0067 |
| | 1.6 | 0.9726 | 0.9757 | 0.9801 | 0.9820 | 1.0032 | 1.0077 | 1.0097 |
| | 1.7 | 0.9654 | 0.9706 | 0.9763 | 0.9785 | 1.0053 | 1.0113 | 1.0136 |
| | 1.8 | 0.9568 | 0.9648 | 0.9722 | 0.9746 | 1.0083 | 1.0161 | 1.0186 |
| | 1.9 | 0.9465 | 0.9583 | 0.9676 | 0.9703 | 1.0124 | 1.0223 | 1.0251 |
| | 2 | 0.9342 | 0.9510 | 0.9626 | 0.9654 | 1.0180 | 1.0304 | 1.0335 |
| | 2.1 | 0.9193 | 0.9428 | 0.9569 | 0.9600 | 1.0256 | 1.0410 | 1.0443 |
| | 2.2 | 0.9013 | 0.9336 | 0.9507 | 0.9540 | 1.0358 | 1.0548 | 1.0585 |
| | 2.3 | 0.8794 | 0.9232 | 0.9438 | 0.9474 | 1.0498 | 1.0732 | 1.0772 |
| | 2.4 | 0.8526 | 0.9114 | 0.9361 | 0.9399 | 1.0690 | 1.0979 | 1.1025 |
| | 2.5 | 0.8192 | 0.8977 | 0.9274 | 0.9317 | 1.0958 | 1.1321 | 1.1373 |
| | 2.6 | 0.7774 | 0.8817 | 0.9176 | 0.9224 | 1.1341 | 1.1803 | 1.1864 |
| | 2.7 | 0.7276 | 0.8623 | 0.9063 | 0.9119 | 1.1852 | 1.2457 | 1.2533 |
| | 2.8 | 0.7009 | 0.8386 | 0.8932 | 0.8999 | 1.1966 | 1.2744 | 1.2841 |
| | 2.9 | 0.7543 | 0.8136 | 0.8776 | 0.8860 | 1.0786 | 1.1635 | 1.1747 |
| | 3 | 0.7920 | 0.8190 | 0.8615 | 0.8694 | 1.0340 | 1.0878 | 1.0978 |

The values shown in Tables 10 and 11 are calculated on the basis of the formulae 1 through 5 wherein the parameters used in the calculation are as follows. A refractive index of a semiconductor for forming a semiconductor multilayer structure 130 is 3.2, a wavelength of a light is 630 nm, metal materials for forming a reflection layer 150 are Au, Ag, Cu, and Al. Furthermore, values which are standardized by a value 1 in case of $d=\lambda/(4n)$ are also indicated.

Referring to Tables 10 and 11, an average reflectivity is more improved than that of the case of $d=\lambda/(4n)$, when a film thickness d of a transparent layer 140 is $3\lambda/(4n)$ or thicker in the case that the reflection layer 150 is formed of Au or Cu, and a refractive index of the transparent layer 140 is within a range of from 1.2 to 3.0 as well as the case that the reflection layer 150 is formed of Ag or Al, and a refractive index of the transparent layer is within a range of from 1.3 to 3.0.

Accordingly, when the transparent layer 140 is formed of a transparent material having a refractive index within a range of from 1.3 to 3.0 so as to have a film thickness of $3\lambda/(4n)$ or thicker, a light-extraction efficiency of a semiconductor light-emitting device can be improved. As a transparent material having a refractive index within a range of from 1.3 to 3.0, tantalum pentoxide, magnesium fluoride, hafnium oxide, indium oxide, tin oxide, zinc oxide, or a metal oxide including any of these oxide materials at a concentration of 80 wt % or more may be used in addition to silicon dioxide, and silicon nitride.

Although the present invention has been described hereinabove in accordance with the embodiments and the Examples, the invention claimed in the appended claims is not restricted by the above-described embodiments and Examples. It should be noted that all the combinations of the characteristic features described in the embodiments and Examples are not necessarily required for the means of solving the problems to be solved by the invention.

What is claimed is:

1. A semiconductor light-emitting device, comprising:
   a support structure; and
   a light-emitting structure,
   wherein the support structure comprises:
      a support substrate; and
      a support substrate side bonding layer disposed on one surface of the support substrate,
   wherein the light-emitting structure comprises:
      a light-emitting structure side bonding layer bonded to the support substrate side bonding layer;
      a reflection region is disposed on the light-emitting structure side bonding layer opposite the support substrate; and
      a semiconductor multilayer structure including a light-emitting layer disposed on the reflection region opposite the light-emitting structure side bonding layer for emitting a light with a predetermined wavelength, and
      a light-extraction surface roughened and disposed on the light-emitting layer opposite the reflection region for reflecting diffusely the light, wherein the reflection region includes a transparent layer comprising a material having electrical insulation with a lower refractive index than that of the semiconductor multilayer structure, and a reflection layer comprising a metallic material, wherein the transparent layer has such a thickness that an interference caused by multiple reflection of light inputted to the transparent layer is suppressed, and has a thickness of at least about half of a value obtained by dividing a central wavelength of light emitted from the light-emitting layer by a refractive index of the transparent layer, and wherein the transparent layer has a refractive index of about 1.3 to about 3.0, and a thickness of not less than about ¾ of the value obtained by said dividing the central wavelength by the refractive index.

2. A semiconductor light-emitting device, comprising:
a support structure; and
a light-emitting structure,
wherein the support structure comprises:
   a support substrate; and
   a support substrate side bonding layer disposed on one surface of the support substrate,
wherein the light-emitting structure comprises:
   a light-emitting structure side bonding layer bonded to the support substrate side bonding layer;
   a reflection region disposed on the light-emitting structure side bonding layer opposite the support substrate; and
a semiconductor multilayer structure including a light-emitting layer disposed on the reflection region opposite the light-emitting structure side bonding layer for emitting a light with a predetermined wavelength, and a light-extraction surface roughened and disposed on the light-emitting layer opposite the reflection region for reflecting diffusely the light, wherein the reflection region includes a transparent layer comprising a material having electrical insulation with a lower refractive index than that of the semiconductor multilayer structure, and a reflection layer comprising a metallic material, wherein the transparent layer has such a thickness that an interference caused by multiple reflection of light inputted to the transparent layer is suppressed, and has a thickness of at least about half of a value obtained by dividing a central wavelength of light emitted from the light-emitting layer by a refractive index of the transparent layer, and wherein the transparent layer comprises a refractive index of about 1.2 to about 3.0, and a thickness of not less than about ⅝ of the value obtained by said dividing the central wavelength by the refractive index.

3. A semiconductor light-emitting device, comprising:
a support structure; and
a light-emitting structure,
wherein the support structure comprises:
   a support substrate; and
   a support substrate side bonding layer disposed on one surface of the support substrate,
wherein the light-emitting structure comprises:
   a light-emitting structure side bonding layer bonded to the support substrate side bonding layer;
   a reflection region disposed on the light-emitting structure side bonding layer opposite the support substrate; and
   a semiconductor multilayer structure including a light-emitting layer disposed on the reflection region opposite the light-emitting structure side bonding layer for emitting a light with a predetermined wavelength, and a light-extraction surface roughened and disposed on the light-emitting layer opposite the reflection region for reflecting diffusely the light, wherein the reflection region includes a transparent layer comprising a material having electrical insulation with a lower refractive index than that of the semiconductor multilayer structure, and a reflection layer comprising a metallic material, wherein the transparent layer has such a thickness that an interference caused by multiple reflection of light inputted to the transparent layer is suppressed, and has a thickness of at least about half of a value obtained by dividing a central wavelength of light emitted from the light-emitting layer by a refractive index of the transparent layer, wherein the light-emitting structure further comprises an interface electrode between the reflection layer and the semiconductor multilayer structure, the interface electrode connecting electrically a surface of the semiconductor multilayer structure opposite the light-extraction surface to the reflection layer, wherein the semiconductor multilayer structure further comprises a surface electrode on a part of a surface thereof where the light-extraction surface is formed, wherein the support substrate comprises a back electrode on a surface thereof opposite the support substrate side bonding layer, and wherein the interface electrode is formed in an area not more than 30% of a surface of the semiconductor multilayer structure on a side of the reflection layer.

4. A semiconductor light-emitting device, comprising:
a support structure; and
a light-emitting structure,
wherein the support structure comprises:
   a support substrate; and
   a support substrate side bonding layer disposed on one surface of the support substrate,
wherein the light-emitting structure comprises:
   a light-emitting structure side bonding layer bonded to the support substrate side bonding layer;
   a reflection region disposed on the light-emitting structure side bonding layer opposite the support substrate; and
   a semiconductor multilayer structure including a light-emitting layer disposed on the reflection region opposite the light-emitting structure side bonding layer for emitting a light with a predetermined wavelength, and a light-extraction surface roughened and disposed on the light-emitting layer opposite the reflection region for reflecting diffusely the light, wherein the reflection region includes a transparent layer comprising a material having electrical insulation with a lower refractive index than that of the semiconductor multilayer structure, and a reflection layer comprising a metallic material, wherein the transparent layer has such a thickness that an interference caused by multiple reflection of light inputted to the transparent layer is suppressed, and has a thickness of at least about half of a value obtained by dividing a central wavelength of light emitted from the light-emitting layer by a refractive index of the transparent layer, and wherein the light-extraction surface includes an unsmooth surface that has an arithmetic average roughness not less than about ¼ of a value obtained by dividing a wavelength of the light by a refractive index of a semiconductor layer composing the light-extraction surface, and at least an angle being not zero and defined by a normal line of an average surface of the light-extraction surface and a normal line of a surface of the light-extraction surface.

* * * * *